United States Patent
Yuzurihara et al.

(10) Patent No.: US 9,072,159 B2
(45) Date of Patent: Jun. 30, 2015

(54) HIGH-FREQUENCY POWER SUPPLY DEVICE AND IGNITION VOLTAGE SELECTION METHOD

(71) Applicant: KYOSAN ELECTRIC MFG. CO., LTD., Yokohama-shi, Kanagawa (JP)

(72) Inventors: Itsuo Yuzurihara, Yokohama (JP); Satoshi Aikawa, Yokohama (JP); Hiroshi Kunitama, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 14/391,373

(22) PCT Filed: Jun. 3, 2013

(86) PCT No.: PCT/JP2013/065338
§ 371 (c)(1),
(2) Date: Oct. 8, 2014

(87) PCT Pub. No.: WO2013/190986
PCT Pub. Date: Dec. 27, 2013

(65) Prior Publication Data
US 2015/0115797 A1    Apr. 30, 2015

(30) Foreign Application Priority Data
Jun. 18, 2012   (JP) .................................. 2012-137140

(51) Int. Cl.
*H01J 7/24*      (2006.01)
*H05B 31/26*     (2006.01)
(Continued)

(52) U.S. Cl.
CPC ............ *H05H 1/46* (2013.01); *H02M 7/53871* (2013.01); *H05H 2001/4682* (2013.01); *H01J 37/32174* (2013.01)

(58) Field of Classification Search
CPC .................. H05H 1/24; H01J 37/32082; H01J 37/32183; H01J 37/32174; H01J 37/32935; H01J 37/32963

USPC ......................................... 315/111.01–111.91
See application file for complete search history.

(56) References Cited

U.S. PATENT DOCUMENTS

| 5,195,045 A | * | 3/1993 | Keane et al. .................. 702/107 |
| 2011/0121735 A1 | * | 5/2011 | Penny ....................... 315/111.21 |

FOREIGN PATENT DOCUMENTS

| JP | 4-36482 A | 2/1992 |
| JP | 2003-178989 A | 6/2003 |

(Continued)

OTHER PUBLICATIONS

International Search Report dated Sep. 3, 2013 issued in corresponding application No. PCT/JP2013/065338.
(Continued)

*Primary Examiner* — Jany Richardson
(74) *Attorney, Agent, or Firm* — Westerman, Hattori, Daniels & Adrian, LLP

(57) ABSTRACT

When RF power is supplied from an RF generator to a load via a power supply unit,
(a) the internal impedance of the RF generator is made lower than the characteristic impedance of the power supply unit, and
(b) the load-end voltage is increased by selecting the electrical length $L_E$ of the power supply unit, which connects between the RF generator and the load to supply RF power, so that the electrical length $L_E$ has a predetermined relation with the fundamental wavelength $\lambda$ of the RF AC. More specifically, the electrical length $L_E$ of the power supply unit is selected in such a way that, when the load end, which is the input end of the load, is in an open state, the electrical length $L_E$ is $(2n-1)\cdot(\lambda/4)-k\cdot\lambda \leq L_E \leq (2n-1)\cdot(\lambda/4)+k\cdot\lambda$ (n is an integer, k is $\{\pi-2\cdot\cos^{-1}(1/K)\}/(4\pi)$) with respect to the fundamental wavelength $\lambda$ of the RF AC.

10 Claims, 13 Drawing Sheets

(51) Int. Cl.
*H05H 1/46* (2006.01)
*H02M 7/5387* (2007.01)
*H01J 37/32* (2006.01)

(56) References Cited

FOREIGN PATENT DOCUMENTS

| | | |
|---|---|---|
| JP | 2004-247401 A | 9/2004 |
| JP | 2010-114001 A | 5/2010 |
| JP | 2010-177525 A | 8/2010 |

OTHER PUBLICATIONS

Written Opinion of the International Searching Authority dated Sep. 3, 2013 issued in corresponding application No. PCT/JP2013/065338; with English Translation.

Notification Concerning Transmittal of the International Preliminary Report on Patentability Chapter I of the Patent Cooperation Treaty) (Form PCT/IB/326) of International Application No. PCT/JP2013/065338 mailed Dec. 31, 2014 with forms PCT/IB/373, PCT/IB/338 and PCT/ISA/237, w/English translation. (9 pages).

* cited by examiner

RF GATE SIGNAL A, B̄

RF GATE SIGNAL Ā, B

GATE CONTROL SIGNAL

RF OUTPUT

FORWARD WAVE POWER

REFLECTED WAVE POWER

FIG. 5A

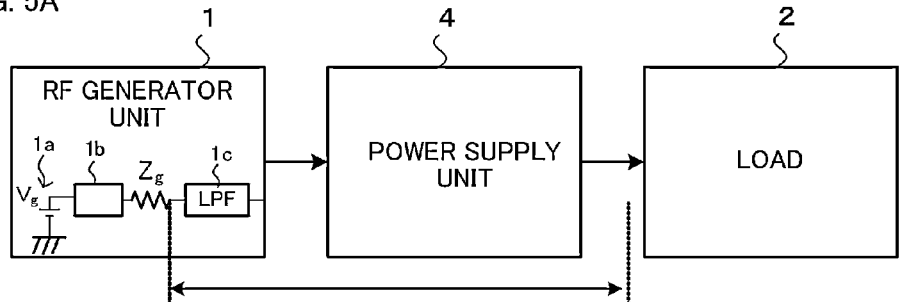

ELECTRICAL LENGTH $L_E$: $(2n-1) \cdot (\lambda/4) - k \cdot \lambda \leq L_E \leq (2n-1) \cdot (\lambda/4) + k \cdot \lambda$

FIG. 5B

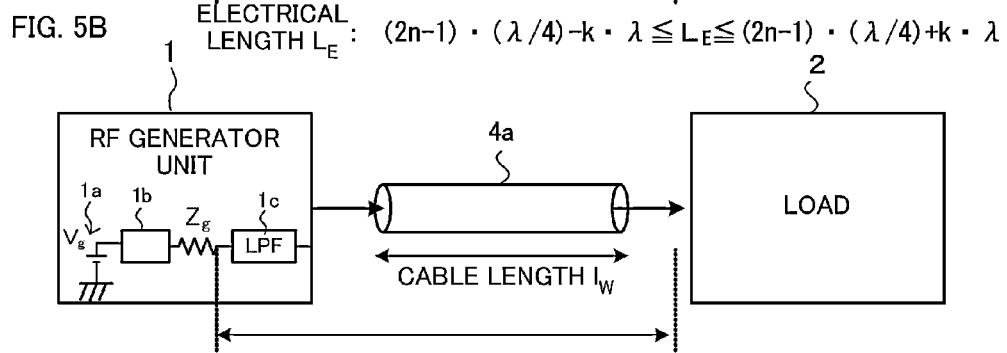

ELECTRICAL LENGTH $L_E$: $(2n-1) \cdot (\lambda/4) - k \cdot \lambda \leq L_E \leq (2n-1) \cdot (\lambda/4) + k \cdot \lambda$

FIG. 5C

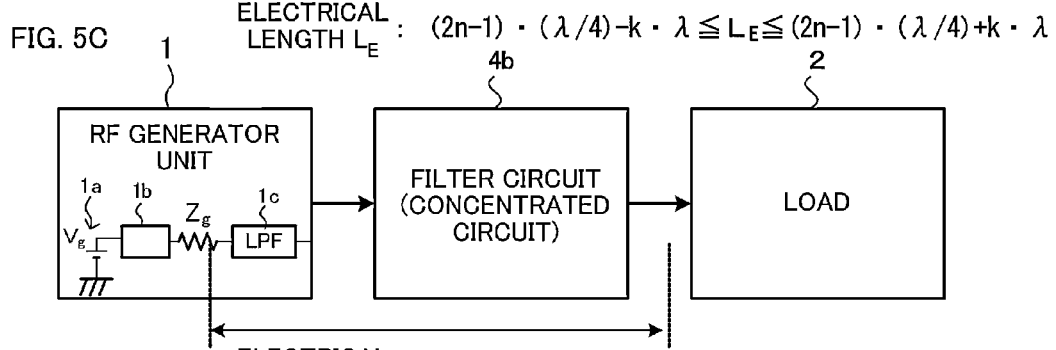

ELECTRICAL LENGTH $L_E$: $(2n-1) \cdot (\lambda/4) - k \cdot \lambda \leq L_E \leq (2n-1) \cdot (\lambda/4) + k \cdot \lambda$

FIG. 5D

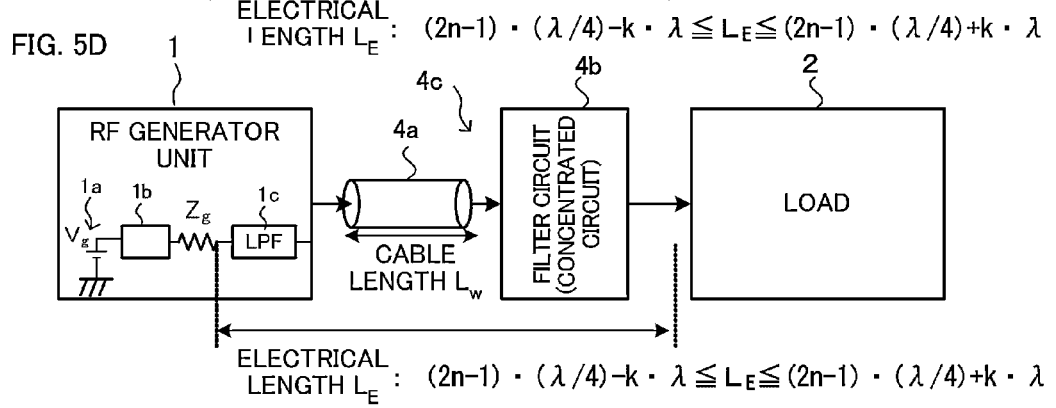

ELECTRICAL LENGTH $L_E$: $(2n-1) \cdot (\lambda/4) - k \cdot \lambda \leq L_E \leq (2n-1) \cdot (\lambda/4) + k \cdot \lambda$

FORWARD WAVE POWER

REFLECTED WAVE POWER    REF DROPPING LEVEL (110% OF RATED POWER)

GENERATOR OUTPUT VOLTAGE

LOAD-END VOLTAGE

REFLECTION STATE BEFORE IGNITION | AFTER IGNITION

FORWARD WAVE POWER

REFLECTED WAVE POWER

REF DROPPING LEVEL (15% OF RATED POWER)

GENERATOR OUTPUT VOLTAGE

LOAD-END VOLTAGE

REFLECTION STATE BEFORE IGNITION

FORWARD WAVE POWER

REFLECTED WAVE POWER

LOAD-END VOLTAGE

HIGH-FREQUENCY POWER SUPPLY DEVICE AND IGNITION VOLTAGE SELECTION METHOD

TECHNICAL FIELD

The present invention relates to an RF generator device, which supplies RF power to a load, and to the selection of a voltage that the RF generator device outputs for generating a predetermined load-end voltage at a load end (an input end on the load side) when RF power is supplied from the RF generator device to the load. More particularly, when the load is a plasma load, the present invention relates to the voltage selection of an ignition voltage (firing voltage) that is a firing voltage when RF power is supplied to the plasma load to generate a plasma discharge.

BACKGROUND ART

A plasma treatment device is a device that generates a plasma discharge by supplying RF power to the electrodes, arranged in a reactor in which plasma is generated, and performs surface treatment for a substrate using the generated plasma. The plasma treatment device is used for semiconductor fabrication and so on.

FIGS. 11 and 12 are diagrams showing an example of the configuration of a plasma treatment device. FIG. 11 shows a simplified equivalent circuit. In the example of the configuration shown in FIG. 11, a plasma treatment device 100, configured by connecting an RF generator 101 to the electrodes of a reactor 102 via a feed cable 104 and an impedance matching box (matching box) 103, applies an ignition voltage to the load end (input end of the load side) to generate plasma and, after generating plasma, supplies RF power to the plasma load.

The RF generator 101 can be configured equivalently by an RF generator voltage 101a ($V_g$), an internal impedance 101b ($Z_g$), and a low-pass filter 101c (LPF).

The matching box 103 achieves impedance matching between the RF generator 101 and the load side to reduce a reflected wave power transmitted from the load side to the RF generator. By doing so, the matching box 103 increases the supply efficiency of the predetermined-frequency RF power supplied from the RF generator 101 to the load.

FIG. 12 is a diagram showing an example of the configuration in which a plurality of RF generator voltages 101a ($V_g$) are used. The figure shows the configuration of a general RF generator 111 in which the output voltages of the plurality of RF generator voltages 101a are combined by a combiner 112 and are output via a low-pass filter 113. In the circuit configuration shown in FIG. 12, the RF generators, each composed of the RF generator voltage 101a ($V_g$), internal impedance 101b ($Z_g$), and low-pass filter 101c (LPF), are connected to the feed cable 104 and the matching box 103 via the combiner 112 and the low-pass filter 113.

When power is supplied to a plasma load, it is known that the discharge voltage is decreased at the load end when the plasma discharge is started. Therefore, when a sufficient ignition voltage is not applied, a decrease in the load-end discharge voltage sometimes results in an unstable plasma ignition. To make plasma ignition stable, the RF generator device, which supplies power to the plasma load, is required to apply a voltage, high enough as an ignition voltage (firing voltage) for generating plasma, to the load end.

Conventionally, a class C RF generator is primarily used as an RF generator because, as compared to a class A RF generator or a class B RF generator, a class C RF generator is efficient and can amplify power to high power with a simple circuit.

In general, when electric power is supplied from an RF generator device to a load via a feed cable to supply power, the following two are known. One is that the load-end voltage depends on the electrical length that is determined by the cable length of the feed cable. The other is that the load-end voltage can be increased by determining the electrical length of the feed cable so that a predetermined relation is satisfied according to the wavelength of the RF power.

The following literatures (Patent Literatures 1-3) describe technologies for performing impedance adjustment and higher-harmonic component matching based on the electrical length $L_E$ determined by the cable length $L_w$ of the feed cable 104 and the wavelength of the RF power.

Patent Literature 1 proposes a plasma CVD device that uses a variable-length coaxial cable as an impedance adjuster to supply power by reducing reflected wave power against the RF generator.

Another known problem is that a standing wave is generated from a forward wave and a reflected wave, which are higher-harmonic components mixed on the transmission line, due to a mismatch among the higher-harmonic components in the RF power. This standing wave indeterminately varies the generation and the distribution characteristics of plasma and, as a result, decreases process reproducibility and reliability in plasma. To address this problem, the following plasma treatment devices are proposed. In one plasma treatment device, the line length of the transmission line made is shorter than $\lambda/2$ or $3\lambda/4$ of the wavelength $\lambda$ of the third higher harmonics of the RF power (See Patent Literature 2). In another plasma treatment device, the cable length is predefined according to the process condition so that the higher-harmonic component level of the reflected wave power becomes equal to or lower than level of the fundamental wave (see Patent Literature 3).

CITATION LIST

Patent Literatures

Patent Literature 1: Japanese Patent Application Publication No. 2003-178989 (claim 9, paragraph [0032])
Patent Literature 2: Japanese Patent Application Publication No. 2004-247401 (claims 1, 2, 3, paragraph [0010])
Patent Literature 3: Japanese Patent Application Publication No. 2010-177525 (paragraph [0009], paragraph [0027])

SUMMARY OF THE INVENTION

Problem to be Solved by the Invention

As described above, it is sometimes required to increase the load end voltage when power is supplied from an RF generator. For example, when the load a plasma load, it is required to apply a voltage, high enough to generate plasma, to the load end to cause the load, which is initially in the plasma non-discharge state, to start discharging plasma and enter the plasma discharge state.

As described in the background art, the problem is known that the discharge voltage drops when the discharge is started at the plasma load. In addition, the technology is known that the load end voltage is increased by changing the electrical length that is determined by changing the cable length of the feed cable. Therefore, in order to apply a voltage, high enough to generate plasma, to the load-end, the application of a technology is assumed that increases the load-end voltage by changing the cable length of the feed cable.

However, when the technology, which increases the load-end voltage by changing the electrical length that is determined by the cable length of the feed cable, is applied to a class C RF generator device that is conventionally used, there are the problems described below: one is the limitation on the load-end voltage and the other is the self-oscillation of the RF generator device. Those problems make it difficult to apply a voltage, high enough to generate plasma, to the load end. Because of these problems, a high voltage cannot be applied to the load end by applying the technology that increases the load-end voltage by changing the cable length of the feed cable.

[Limitation on Load End Voltage]

The problem with the conventional RF generator device is that the load end voltage is limited to a voltage equal to or lower than the generator voltage. Because the load end voltage is limited to a voltage equal to or lower than the generator voltage due to its characteristics of the amplification method, the class C RF generator cannot generate an ignition voltage (firing voltage) high enough to ignite plasma, thus limiting the ignition performance of plasma.

FIG. 13 is a diagram showing an equivalent circuit of the class C RF generator 101 shown in FIG. 11. The class C RF generator, which causes the power amplifier device of the class C amplifier circuit to operate as a voltage dropper, makes the power variable by equivalently changing the internal impedance $Z_g$.

In general, to maximize the power supplied to the load at a rated output time with the internal impedance $Z_g$ of the RF generator 101 matched to the load impedance $Z_{in}$ viewed from the RF generator 101, the internal impedance $Z_g$ of the class C RF generator is usually set equal to the load impedance $Z_{in}$.

For example, when the impedance of the load impedance $Z_L$ is 50 [ohm] and the characteristic impedance $Z_o$ of the cable is also 50 [ohm], the load impedance $Z_{in}$ becomes 50 [ohm]. Therefore, the internal impedance $Z_g$ of the class C RF generator is set to 50 [ohm] at the rated output time of the RF generator.

That the power supply $P_L$ to the load impedance $Z_L$ is maximized when $Z_{in}=Z_L$ can be derived, for example, from the expression given below.

The power supply $P_L$ to the load impedance $Z_L$ is expressed by expression (1) given below.

$$P_L = \{V_g/(Z_g+Z_L)\}^2 \times Z_L \quad (1)$$

To maximize the power supply $P_L$, the condition in which the value generated by differentiating expression (1) with respect to the load impedance $Z_L$, $(dP_L/dZ_L)$, is "0" must be satisfied.

$$(dP_L/dZ_L) = V_g^2 \times \{1/(Z_g+Z_L)^2 - 2Z_L/(Z_g+Z_L)^3\} = 0 \quad (2)$$

$$Z_g = Z_L \quad (3)$$

Expression (3) given above indicates that the power supply $P_L$ is maximized when the internal impedance $Z_g$ matches the load impedance $Z_L$.

Therefore, when the load impedance $Z_L$ is assumed for the load where the voltage-standing-wave-ratio (VSWR) is infinite, the maximum value of the load-end voltage $V_L$, output by the class C RF generator, is limited to the RF generator voltage $V_g$.

For example, when the load is a rated load $Z_L=50$ [ohm], the load-end voltage $V_L$, which can be output by the class C RF generator, is $V_g/2$ produced by voltage-dividing the RF generator voltage $V_g$ by the internal impedance $Z_g$ and load resistance $Z_L$. This voltage becomes a rated voltage. When the load is in the open state, the load-end voltage $V_L$ that can be output by the class C RF generator is the RF generator voltage $V_g$. In this case, the load-end voltage can be increased at most to the twice of the rated voltage ($V_g/2$).

Therefore, a voltage, higher than the RF generator voltage $V_g$, cannot be generated as the load end voltage that works as an ignition voltage to cause a plasma load, which is in the plasma non-discharge state, to start discharging plasma.

As described above, when the internal impedance $Z_g$ of the RF generator device and the load impedance $Z_{in}$ are matched, the end voltage is constant regardless of the cable length. Even when the electrical length is changed by changing the cable length, the end voltage is limited to a voltage equal to or lower than the generator voltage. This means that a high voltage cannot be applied to the load end.

No literatures cited in the background art disclose that the load-end voltage is increased by making the cable length variable.

(Patent Literature 1): The feed cable described in Patent Literature 1 works as an impedance adjuster, which reduces reflected wave power and increases power supply efficiency, by making the cable length of the coaxial cable variable, but Patent Literature 1 does not disclose anything about the load end voltage.

(Patent Literature 2): The feed cable described in Patent Literature 2 is that, to inhibit the higher harmonic components of the RF generator from forming a standing wave on the transmission line, the line length of the transmission line is made shorter than $\lambda/2$ or $3\lambda/4$ of the wavelength $\lambda$ of the third higher harmonics of the RF power to prevent the load end from becoming a shorted end or an open end, but Patent Literature 2 does not disclose anything about the load end voltage.

(Patent Literature 3): The feed cable described in Patent Literature 3 is a feed cable for which the cable length is predefined according to the process condition so that the higher harmonic wave level of the reflected wave power becomes equal to or lower than the fundamental wave level, but Patent Literature 3 does not disclose anything about the load end voltage.

As described above, Patent Literatures 1-3 describe the technologies for reducing reflected wave power using a feed cable but does not describe anything about increasing the load-end voltage to an ignition voltage (firing voltage) that is high enough to generate plasma. In addition, all literatures describe the technologies for supplying power to maintain already-generated plasma stably. Therefore, when plasma is not yet generated, the problem is that the technologies described in the literatures given above are not applicable to the selection of an ignition voltage to be applied to the load end for generating plasma.

[Self-Oscillation of Class C RF Generator]

The problem with a class C RF generator, conventionally used as an RF generator, is an abnormal condition of self-oscillation generated during the process of state change from the non-discharge state to the impedance-matched, plasma discharge state. Self-oscillation, if generated, results in an impedance matching loss, generating the problem that the load-end voltage is limited to the generator voltage or lower.

A class C RF generator, which uses a class C amplifier to amplify the power, generates self-oscillation when an allowable reflected wave power is exceeded. Self-oscillation, when generated in an RF generator, causes the RF generator to oscillate at a frequency different from a desired frequency intended by the RF generator. This prevents the impedance matching box from performing the normal operation at a pre-set frequency, with the result that plasma ignition becomes difficult and the generated plasma becomes unstable, for example, a plasma flicker occurs.

To avoid a self-oscillation phenomenon, the forward wave power is sometimes caused to drop so that the reflected wave power becomes equal to or lower than the allowable reflected wave power. For example, the allowable reflected wave power that does not cause self-oscillation is determined, and this allowable reflected wave power (for example, 20% of the rated forward wave power), is set as the dropping level. When the reflected wave power exceeds the dropping level, the dropping operation is performed to limit the forward wave power. When the reflected wave power exceeds the dropping level and, as a result, the operation of the dropping protection is started in this manner, the forward wave power is reduced and, therefore, it becomes difficult to ignite plasma.

Dropping the forward wave power to limit its power reduces a self-oscillation phenomenon but, instead, prevents enough power from being supplied to the load. This deteriorates plasma ignition-ability and makes plasma unstable as when a self-oscillation phenomenon occurs.

The problem with a class C RF generator that the tolerance for a reflected wave power is low and a self-oscillation phenomenon easily occurs is generated by the amplifying characteristic of the class C amplifier given below.

The power amplifier device of a class C amplifier uses the active region (linear region). Therefore, when reflected wave power is fed back via drain-to-gate feedback impedance of the power amplifier device, self-oscillation occurs if natural oscillation superimposed on this reflected wave power is amplified in the active region and, as a result, the self-oscillation condition is satisfied.

In addition, when the voltage standing wave ratio (VSWR) is large for the electrical length that is determined by the cable length and the matching circuit constant and, at the same time, when the electrical length matches the feedback capacitance of the power amplifier device of the class C amplifier and the self-oscillation condition is satisfied as in the case described above, the power amplifier device of the class C amplifier resonates at this matching natural frequency and the self-oscillation phenomenon continues.

Therefore, even if the technology is applied to the conventional RF generator device for increasing the load-end voltage through the adjustment of the electrical length by changing the cable length of the feed cable through which power is supplied to the load, an ignition voltage, high enough to generate a plasma discharge, cannot be applied.

It is an object of the present invention to solve the conventional problem described above. More specifically, an object of the present invention is to increase the load-end voltage during an RF power supply in which RF power is supplied to the load and to apply an ignition voltage, high enough to generate a plasma discharge, to the load end of a plasma load.

Means for Solving the Problem

When RF power is supplied from an RF generator to a load via a power supply unit, the present invention
(a) makes the internal impedance of the RF generator lower than the characteristic impedance of the power supply unit, and
(b) selects the electrical length of the power supply unit, which connects between the RF generator and the load to supply RF power, so that the electrical length has a predetermined relation with the fundamental wavelength $\lambda$ of the RF AC. The configuration described above at least makes the load-end voltage higher than the RF generator voltage that is proportional to the voltage of DC power supply of the RF generator device.

In the configurations (a) and (b) described above, the RF generator having a lower internal impedance described in (a) may be implemented using an RF generator that converts the DC of a DC power supply to an RF AC by the switching operation with a constant duty ratio (for example, duty ratio 50%). This RF generator may be a class D RF generator using a class-D amplifier circuit (Class D: IEC international standard IEC 60268-3,4 classes of operation).

The selection of the electrical length of the power supply unit described in (b) is determined in such a way that the electrical length $L_E$ when the load end of the cable, which is the input end of the load, is in an open state (no-discharge state) is $(2n-1)\cdot\lambda/4 - k\cdot\lambda \leq L_E \leq (2n-1)\cdot\lambda/4 + k\cdot\lambda$ with respect to the fundamental wavelength $\lambda$ of the RF AC. n is an integer, $k\cdot\lambda$ represents the range of the electrical length $L_E$ in which the load-end voltage ($V_z(z=L_E)$) is equal to or higher than the voltage that is set, and the constant k, which means that the load-end voltage ($V_z(z=L_E)$) is the K times of the RF generator voltage $V_g$, is represented as "$\{\pi - 2\cdot\cos^{-1}(1/K)\}/(4\pi)$".

For example, the multiplying factor K when the load-end voltage ($V_z(z=L_E)$), which is the ignition voltage, is more than twice as high as that of the RF generator voltage $V_g$, is 2 and, in this case, $k\cdot\lambda$ is "$\lambda/12$".

Therefore, the load-end voltage ($V_z(z=L_E)$) can be made twice or more as high as the RF generator voltage $V_g$ by setting the electrical length $L_E$ of the cable in the range that extends on both sides of "$(2n-1)\cdot(\lambda/4)$" for "$\lambda/12$".

In another example, the multiplying factor K when the load-end voltage ($V_z(z=L_E)$), which is the ignition voltage, is equal to or higher than the RF generator voltage $V_g$, is 1 and, in this case, $k\cdot\lambda$ is "$\lambda/4$".

Therefore, the load-end voltage ($V_z(z=L_E)$) can be made equal to or higher than the RF generator voltage $V_g$ by setting the electrical length $L_E$ of the cable in the range that extends on both sides of "$(2n-1)\cdot(\lambda/4)$" for "$\lambda/4$".

When "$\lambda/4$" is set as the value of $k\cdot\lambda$, the range of the electrical length $L_E$ includes all the range with the result that the load-end voltage ($V_z(z=L_E)$) is a voltage equal to or higher than the RF generator voltage $V_g$ for any cable length. This indicates that, in the configuration described in (a) in which the internal impedance of the RF generator is lower than the characteristic impedance of the power supply unit, the load-end voltage ($V_z(z=L_E)$) can be set to a voltage equal to or higher than the RF generator voltage $V_g$ for any cable length that is set.

The electrical length $L_E$ is an electrical length from the RF generator to the output end of the impedance matching box and, in FIG. 1 that will be described later, from the input end of the LPF 1c of the RF generator unit 1 to the output end of the impedance matching box.

The load-end voltage $V_L$ ($V_z(z=L_E)$) can be increased by selecting an RF generator with a low internal impedance $Z_g$ as described in (a) and an electrical length $L_E$ of the cable of the power supply unit as described in (b).

The present invention provides an aspect of an RF power supplying device and an aspect of an ignition voltage selection method.

[Aspect of RF Power Supplying Device]

An RF power supplying device of the present invention includes an RF generator unit that converts a DC of a DC power supply to an RF AC through a switching operation; and a power supply unit connected between an output end of the RF generator unit and a load end, which is an input end of a load, to supply the RF AC to the load.

The internal impedance $Z_g$ of the RF generator unit is lower than the characteristic impedance $Z_o$ of the power supply unit. The electrical length $L_E$ of the power supply unit when the load end is in an open state is a value selected as $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC. n is an integer, $k\cdot\lambda$ represents the range of the electrical length $L_E$ in which the load-end voltage $(V_z(z=L_E))$ becomes equal to or higher than the voltage that is set, and the constant k, which means that the load-end voltage $(V_z(z=L_E))$ is the K times of the RF generator voltage $V_g$, is represented as "$\{\pi-2\cdot\cos^{-1}(1/K)\}/(4\pi)$".

The RF generator unit, a power supply device that converts the DC of a DC power supply to an RF AC through the switching operation, may be configured, for example, by a DC power supply, an inverter circuit, and a low-pass filter (LPF).

The inverter circuit has an RF power amplifier device that performs the switching operation via the RF gate signal. The RF power amplifier device performs the switching operation via the RF gate signal to turn on and off the DC voltage $V_{dc}$ of the DC power supply to form a trapezoid wave, for example, with a duty ratio of 50%. The filter circuit receives the trapezoid wave from the inverter circuit and outputs a sine wave.

The internal impedance of the RF generator unit can be represented by the impedance (on-impedance) that is measured when the RF amplification device is on. The impedance measured when the RF power amplifier device is on is as low as about several [ohm]. This impedance is sufficiently lower than the characteristic impedance 50 [ohm] of a coaxial cable generally used as the feed cable.

The power supply unit electrically connects between the RF generator and the load and supplies RF AC, output by the RF generator, to the load. The power supply unit may be a feed cable such as a coaxial cable, a filter circuit composed of a capacitor and a reactor, or a series circuit composed of a feed cable and a filter circuit. The impedance of the power supply unit can be represented by a distribution constant when the power supply unit is a feed cable, and by a concentrated constant when the power supply unit is a filter circuit.

The electrical length $L_E$, the length of a signal wave that is transmitted through a transmission line, is represented based on the wavelength $\lambda$ of the signal wave that is transmitted through the transmission line.

The power supply unit of the present invention can be in one of a plurality of modes.

A first mode of the power supply unit of the present invention is a feed cable that electrically connects between the output end of the RF generator unit and the load end of the load.

The internal impedance of the RF generator unit is lower than the characteristic impedance of the feed cable, and the electrical length $L_E$ of the feed cable when the load end of the load is in the open state is a length in electrical length selected as $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC. n is an integer, $k\cdot\lambda$ represents the range of the electrical length $L_E$ in which the load-end voltage $(V_z(z=L_E))$ becomes equal to or higher than the voltage that is set, and the constant k, which means that the load-end voltage $(V_z(z=L_E))$ is the K times of the RF generator voltage $V_g$, is represented as "$\{\pi-2\cdot\cos^{-1}(1/K)\}/(4\pi)$".

A second mode of the power supply unit of the present invention is a filter circuit that electrically connects between the output end of the RF generator unit and the load end of the load, with the filter circuit composed of a capacitor and a reactor.

The internal impedance of the RF generator unit is lower than the characteristic impedance of the filter circuit, and the values of the capacitor and the reactor of the filter circuit are adjusted so that the electrical length $L_E$ of the filter circuit when the load end is in the open state is an electrical length selected as $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC. n is an integer, $k\cdot\lambda$ represents the range of the electrical length $L_E$ in which the load-end voltage $(V_z(z=L_E))$ becomes equal to or higher than the voltage that is set, and the constant k, which means that the load-end voltage $(V_z(z=L_E))$ is the K times of the RF generator voltage $V_g$, is represented as "$\{\pi-2\cdot\cos^{-1}(1/K)\}/(4\pi)$".

A third mode of the power supply unit of the present invention is a series circuit that electrically connects between the output end of the RF generator unit and the load end of the load. The series circuit includes a filter circuit and a feed cable, and the filter circuit includes a capacitor and a reactor.

The internal impedance of the RF generator unit is lower than the characteristic impedance of the power supply unit, and the electrical length $L_E$ of the series circuit, composed of the filter circuit and the feed cable, when the load end is in the open state is an electrical length $L_E$ selected as $(2n-1)\cdot\lambda/4-k\cdot\lambda \leq L_E \leq (2n-1)\cdot\lambda/4+k\cdot\lambda$. n is an integer, $k\cdot\lambda$ represents the range of the electrical length $L_E$ in which the load-end voltage $(V_z(z=L_E))$ becomes equal to or higher than the voltage that is set, and the constant k, which means that the load-end voltage $(V_z(z=L_E))$ is the K times of the RF generator voltage $V_g$, is represented as "$\{\pi-2\cdot\cos^{-1}(1/K)\}/(4\pi)$".

[Aspect of Ignition Voltage Selection Method]

An ignition voltage selection method of the present invention is a method for selecting an ignition voltage that causes a plasma load to generate a plasma discharge at the load end that is the input end of the plasma load.

When an RF generator unit supplies an RF AC to the plasma load via a power supply unit, the RF generator converts the DC of a DC power supply to an RF AC through the switching operation to make the internal impedance of the RF generator lower than the characteristic impedance of the power supply unit.

When the plasma load is in a non-discharge state, the power supply unit adjusts the cable length $L_w$ of the power supply unit when the load end of the plasma load is in an open state so that the electrical length $L_E$ is $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC, and selects the voltage of the load end of the plasma load, determined by the electrical length $L_E$, as the ignition voltage. n is an integer, $k\cdot\lambda$ represents the range of the electrical length $L_E$ in which the load-end voltage $(V_z(z=L_E))$ becomes equal to or higher than the voltage that is set, and the constant k, which means that the load-end voltage $(V_z(z=L_E))$ is the K times of the RF generator voltage $V_g$, is represented as "$\{\pi-2\cdot\cos^{-1}(1/K)\}/(4\pi)$".

As in the aspect of the RF power supplying device, the power supply unit of the present invention is in one of a plurality of modes.

A first mode of the power supply unit of the present invention is a feed cable that electrically connects between the output end of the RF generator unit and the load end of the plasma load. The internal impedance of the RF generator unit is lower than the characteristic impedance of the feed cable, the electrical length $L_E$ of the cable length $L_w$ of the feed cable when the load end of the plasma load is in an open state is a length selected as $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC, and the voltage of the load end of the plasma load, determined by the cable length, is selected as the ignition voltage. n is an integer, $k\cdot\lambda$ represents the range of the electrical length $L_E$ in which the load-end voltage $(V_z(z=L_E))$ becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

A second mode of the power supply unit of the present invention is a filter circuit that electrically connects between the output end of the RF generator unit and the load end of the plasma load, with the filter circuit composed of a capacitor and a reactor. The internal impedance of the RF generator unit is lower than the characteristic impedance of the filter circuit, the values of the capacitor and the reactor of the filter circuit are adjusted so that the electrical length $L_E$ of the filter circuit when the load end of the plasma load is in an open state is selected as $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC, and the voltage of the load end of the plasma load, determined by the filter circuit, is selected as the ignition voltage. n is an integer, $k\cdot\lambda$ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

A third mode of the power supply unit of the present invention is a series circuit, which includes a filter circuit and a feed cable, that electrically connects between the output end of the RF generator unit and the load end of the plasma load. The filter circuit includes a capacitor circuit and a reactor circuit.

The internal impedance of the RF generator unit is lower than the characteristic impedance of the power supply unit, the length of the feed cable and values of the capacitor and the reactor of the filter circuit in the series circuit are adjusted so that the electrical length $L_E$ when the load end of the plasma load is in an open state is selected as $(2n-1)\cdot\lambda/4-k\cdot\lambda \leq L_E \leq (2n-1)\cdot\lambda/4+k\cdot\lambda$ with respect to the fundamental wavelength $\lambda$ of the RF AC, and the voltage of the load end of the plasma load, determined by the series circuit, is selected as the ignition voltage. n is an integer, $k\cdot\lambda$ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

In the present invention, an RF generator, such as a class-D RF generator, is used to convert the DC of a DC power supply to an RF AC through the switching operation.

This RF generator, which amplifies power using the saturation region of the RF power amplifier device, avoids the effect of the natural oscillation of a reflected wave fed back from the load side via the feedback capacitance, thus preventing the generation of a self-oscillation phenomenon.

Because the generation of a self-oscillation phenomenon is reduced, the RF generator allows 100% or higher reflected wave power within the allowable power dissipation of the RF power amplifier device. In a conventional class-C RF generator, the dropping protection is provided by setting the reflected wave power of about 20% of the rated forward wave power as the dropping level. This dropping protection involves a problem such as the generation of unstable plasma. In contrast, the RF generator of the present invention, which does not provide the dropping protection but allows 100% or higher reflected wave power, prevents a plasma ignition failure and an unstable operation caused by a reduction in the forward wave power.

The RF generator of the present invention does not provide the dropping protection for, but allows, 100% or higher reflected wave power as described above because the plasma ignition operation (ignition operation) is usually performed in a short period of time. However, in the case where 100% or higher reflected wave power continues for a long time for some reason or other, the dropping protection may be provided to protect against heat.

Effects of the Invention

During an RF power supply in which RF power is supplied to a load, the RF power supplying device and the ignition voltage selection method of the present invention can increase the load-end voltage as described above. When the load is a plasma load, an ignition voltage, high enough to generate a plasma discharge, can be selected as the load-end voltage of the plasma load.

BRIEF DESCRIPTION OF THE DRAWINGS

FIG. 5 is a diagram showing the selection of the electrical length of the power supply unit of the present invention.

MODE FOR CARRYING OUT THE INVENTION

Embodiments of the present invention are described below in detail with reference to the drawings. The following describes an RF power supplying device and an ignition voltage selection method of the present invention. An example of the configuration of an RF power supplying device is described with reference to FIG. 1, an example of one configuration of an RF power amplifier circuit provided in an RF generator device of the present invention is described with reference to FIG. 2, the signals of the RF power amplifier circuit are described with reference to FIG. 3, the relation between the electrical length of a power supply unit and the load-end voltage is described with reference to FIG. 4, an example of the selection of the electrical length of the power supply unit of the present invention is described with reference to FIG. 5, the relation between the electrical length $L_E$ and the load-end voltage ($V_z(z=L_E)$) is described with reference to FIG. 6, the relation between the electrical length $L_E$ and the K times of the RF generator voltage $|V_g|$ is described with reference to FIG. 7, an embodiment of the present invention is described with reference to FIG. 8, the ignition operation and the dropping operation in a conventional configuration are described with reference to FIG. 9, and the re-ignition operation is described with reference to FIG. 10.

[Example of the Configuration of RF Power Supplying Device]

First, an example of the configuration of an RF power supplying device of the present invention is described with reference to FIG. 1.

Figure 1:
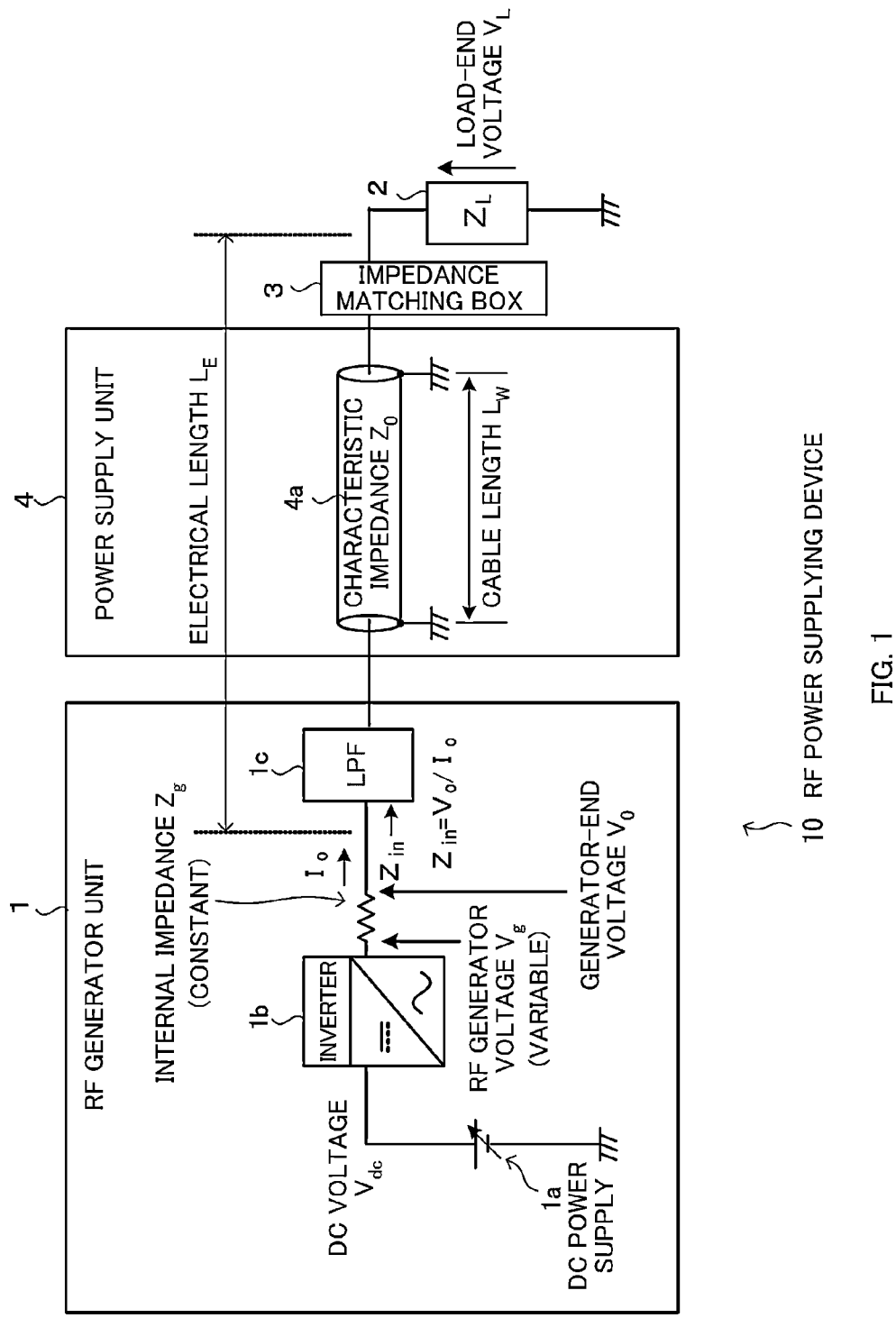
FIG. 1 is a diagram showing an example of the configuration of an RF power supplying device of the present invention.

An RF power supplying device 10 of the present invention, shown in FIG. 1, supplies RF power, generated by an RF generator unit 1, to a load 2 via a power supply unit 4 and an impedance matching box (matching box) 3. The load 2 may be a plasma load. The plasma load is generated by generating plasma by arranging counter electrodes in a reactor and supplying RF power between the counter electrodes. In FIG. 1, the configurations of the reactor and the electrodes are not shown in the load 2.

The impedance matching box 3 performs impedance matching between the RF generator unit 1 side and the load 2 side to reduce reflected waves sent from the load 2 side to the RF generator unit 1, thereby increasing the supply of RF power from the RF generator unit 1 to the load 2.

The power supply unit 4 is connected between the RF generator unit 1 and the impedance matching box 3 and, via the power supply unit 4, RF power is supplied from the RF generator unit 1 to the load 2. The power supply unit 4 is one of the following three: a feed cable such as a coaxial cable, a filter circuit composed of a capacitor circuit and a reactor circuit, and a series circuit composed of a feed cable and a filter circuit.

The RF generator unit 1 is a power device that performs the switching operation to convert the DC voltage $V_{dc}$ of a DC power supply 1a to an RF alternate current. For example, the RF generator unit 1 is configured by the DC power supply 1a, an inverter circuit 1b, and a filter circuit 1c such as a low-pass filter (LPF).

The inverter circuit 1b has an RF power amplifier device (not shown) that performs the switching operation via the RF gate signal (not shown). The RF power amplifier device performs the switching operation via the RF gate signal to turn on and off the DC voltage $V_{dc}$ of the DC power supply 1a to form a trapezoid wave, for example, with a duty ratio of 50%. The filter circuit 1c receives the trapezoid wave from the inverter circuit 1b and outputs a sine wave.

Figure 2:
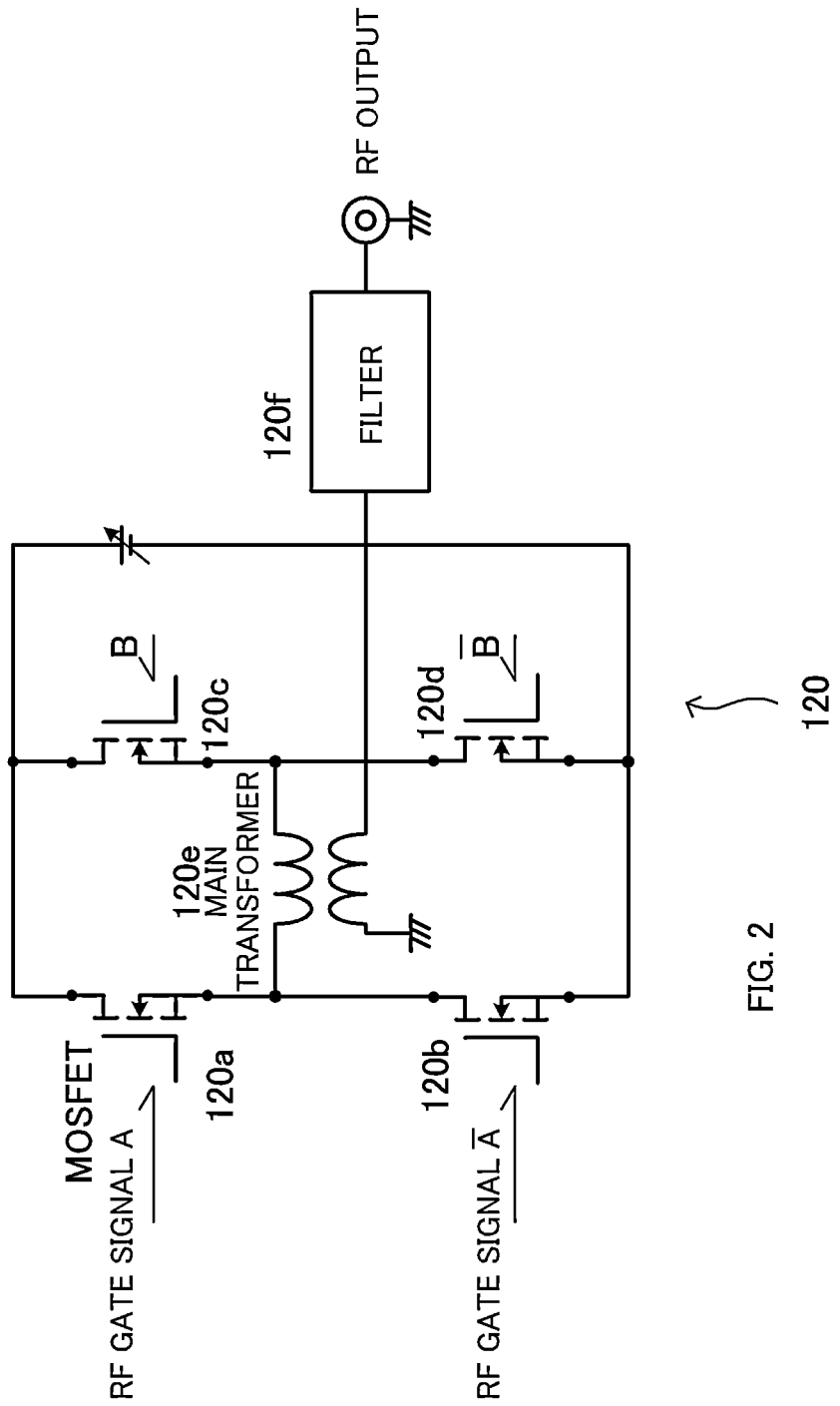
FIG. 2 is a diagram showing an example of one configuration of an RF power amplifier circuit provided in an RF generator device of the present invention.

FIG. 2 shows an example of one configuration of an RF power amplifier circuit provided in the RF generator. FIG. 3 is a diagram showing the RF gate signal that drives and controls the RF power amplifier circuit, the RF output, and the forward wave power to, and the reflected wave power from, the plasma load.

Figure 3A:
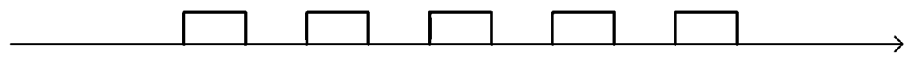
FIG. 3 is a diagram showing the signals of the RF power amplifier circuit.
Figure 3B:

In an RF power amplifier circuit 120 shown in FIG. 2, MOSFETs 120a-120d are in the bridge configuration. The connection point between the series-connected MOSFET 120a and the MOSFET 120b and the connection point between the series-connected MOSFET 120c and the MOSFET 120d are connected by a main transformer 120e. The output of the main transformer 120e, obtained via a filter 120f, is output as an RF output. The MOSFETs 120a-120d are driven and controlled by the RF gate signals A, A*, B, and B* (FIGS. 3A, 3B).

The RF gate signals A and A* (in FIG. 2, the symbol "-" is shown above the letter A to indicate an inverse signal), which are signals for driving and controlling the series circuit of the MOSFET 120a and the MOSFET 120b, are in reverse phase. The RF gate signals B and B* (in FIG. 2, the symbol "-" is shown above the letter B to indicate an inverse signal), which are signals for driving and controlling the series circuit of the MOSFET 120c and the MOSFET 120d, are in inverse phase. The RF gate signal A and the RF gate signal B are in inverse phase.

Figure 3C:
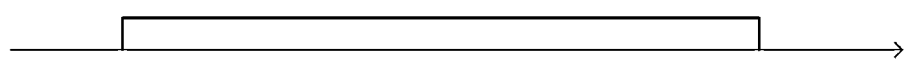
Figure 3D:
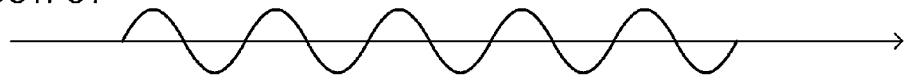

The RF gate signals A, A*, B, and B* (FIGS. 3A, 3B) are controlled by the gate control signal (FIG. 3C). The RF gate signals A, A*, B, and B* are output when the gate control signal is on. The RF output (FIG. 3D) is output during this period.

Figure 3E:
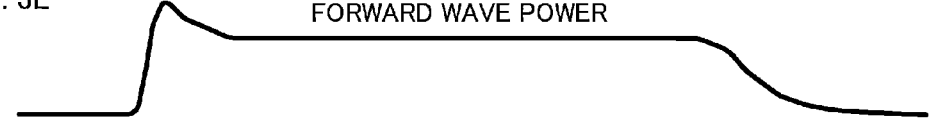
Figure 3F:

FIGS. 3E and 3F show the forward wave power and the reflected wave power at the plasma load. Referring to FIG. 3F, the reflected wave power is generated transiently in the plasma load, on which the impedance matching box is installed, when the RF gate signal (FIGS. 3A, 3B) rises, and is attenuated after the stabilization time elapses (FIGS. 3E and 3F).

In the case of a class C RF generator, a self-oscillation phenomenon sometimes occurs when the reflected wave power exceeds the allowable reflected wave power of the class C RF generator. An allowable reflected wave power that does not generate a self-oscillation phenomenon is determined. For example, the dropping level of this allowable reflected wave power is set to 20% of the rated forward wave power. In this case, when the reflected wave power exceeds the dropping level, the dropping protection operation is performed to decrease the forward wave power and, therefore, it becomes difficult to ignite plasma.

The DC voltage $V_{dc}$ from the DC power supply 1a is converted to a trapezoid AC by the inverter circuit 1b according to the duty ratio (for example, 50%) of the RF gate signal. During this AC conversion, the peak voltage value may be made variable based on the DC voltage $V_{dc}$.

The RF power output from the RF generator unit 1 is represented by the power-end voltage $V_o$ and the output current $I_o$.

The internal impedance $Z_g$ of the RF generator unit 1 can be represented by the impedance (on-impedance) that is measured when the RF amplification device (not shown) provided in the inverter circuit 1b is on. The impedance measured when the RF power amplifier device is on is as low as about several [ohm]. This impedance is sufficiently lower than the characteristic impedance 50 [ohm] of a coaxial cable generally used as the feed cable and, therefore, may be treated as a constant value.

The power supply unit 4 may be configured not only by a feed cable 4a with the characteristic impedance of $Z_o$ and the cable length of $L_w$ and but also by a filter circuit 4b composed of a capacitor circuit and a reactor circuit or by a series circuit of the feed cable 4a and the filter circuit 4b.

FIG. 5 shows examples of the configuration of the power supply unit 4. FIG. 5B shows an example in which the feed cable 4a is used as the power supply unit 4, FIG. 5C shows an example in which the filter circuit 4b, composed of a capacitor circuit and a reactor circuit, is used as the power supply unit 4, and FIG. 5D shows an example in which a series circuit 4c, composed of the feed cable 4a and the filter circuit 4b, is used.

[Relation Between Electrical Length of Power Supply Unit and Load-End Voltage]

Figure 4:
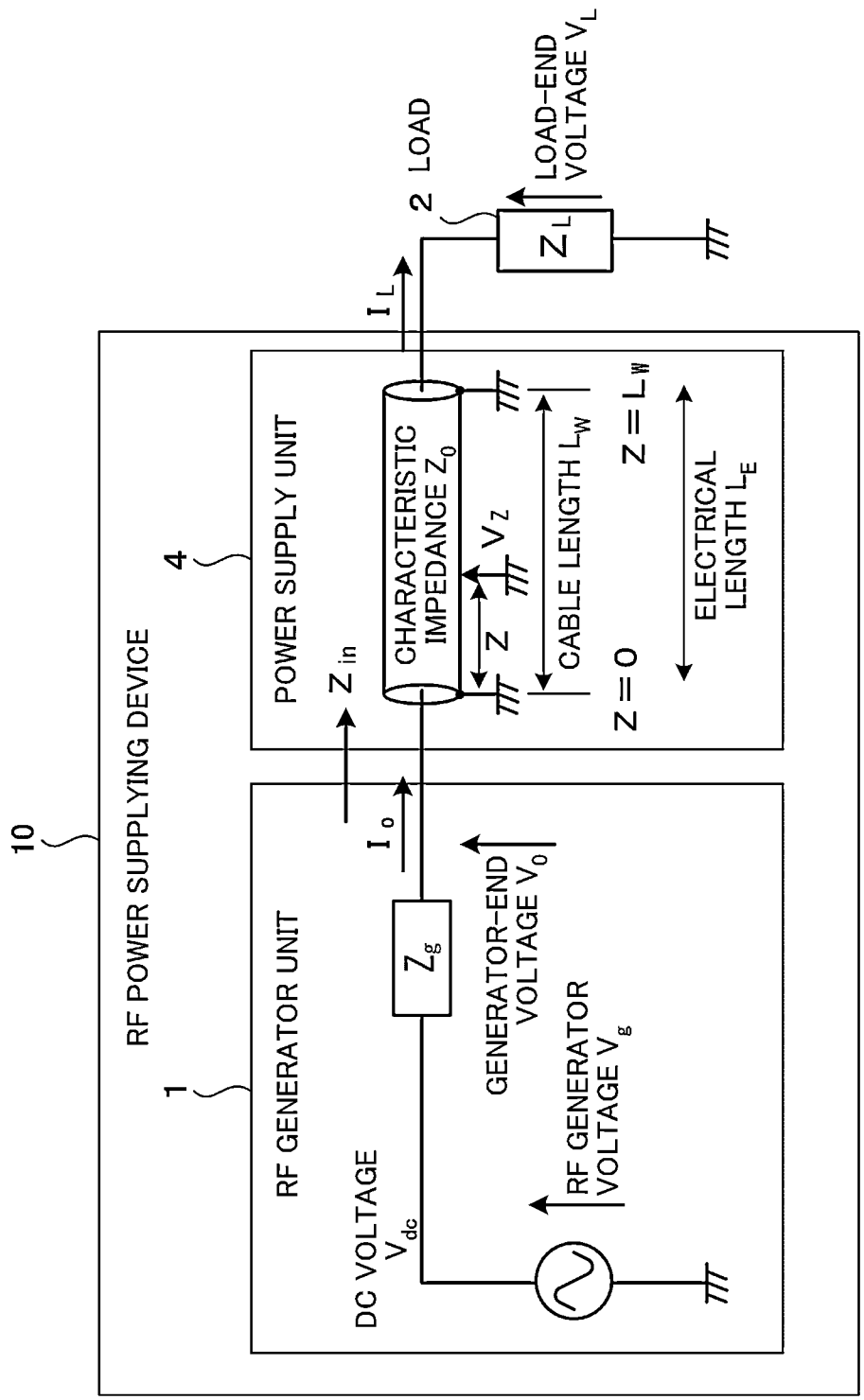
FIG. 4 is a diagram showing the relation between the electrical length of a power supply unit and the load-end voltage of the present invention.

Next, referring to FIG. 4, the following describes the relation between the electrical length of the power supply unit of the present invention and the load-end voltage. FIG. 4 shows an equivalent circuit of the circuit configuration of the RF power supplying device of the present invention shown in FIG. 1. FIG. 4 shows an example in which a coaxial cable, with the characteristic impedance of Z. and the cable length of $L_w$, is used as the power feed cable. The cable length $L_w$ in this example corresponds to the electrical length $L_E$.

In FIG. 4, the voltage $V_z$ at a given point Z of the cable with the cable length of $L_w$ is represented by expression (4) given below. The given point Z is a point determined in such a way that the end position of the cable on the RF generator unit 1 side is Z=0 and that the end position of the cable on the load 2 side is $Z=L_w$=electrical length $L_E$.

$$V_z = A \cdot \exp(-j\beta Z) + B \cdot \exp(j\beta Z) \quad (4)$$

$$\beta = 2\pi/\lambda \ (\lambda \text{ is wavelength of RF output}) \quad (5)$$

In expressions (4) and (5), the constants A and B can be determined by the conditions of $V_g$, $Z_g$, $V_L$, and $I_L$ shown in FIG. 4. $V_L$ is the voltage ($V_z(z=L_w)$) at the point Z, and $I_L$ is the current supplied from the RF power supplying device 10 to the load 2. Because there is no need to represent the constants A and B as an expression in the relation between the electrical length and the load-end voltage, the description is omitted here.

When the load $Z_L$ is in the open state, that is, when $Z_L \to \infty$, the voltage $V_z$ in expression (4) given above is represented by expressions (6) and (7) below.

$$V_z = [Z_O \cdot V_g \cdot \{\exp(-j\beta(Z-L_E)) + \exp(j\beta \exp(z-L_E))\}] \quad (6)$$

$$P = 2 \cdot Z_O \cdot \cos(\beta \cdot L_E) + j2 \cdot Z_g \cdot \sin(\beta \cdot L_E) \quad (7)$$

The point Z on the cable, where the voltage $V_z$ takes the extreme value, can be obtained from the value of Z that sets the value of expression (8), given below, to "0", wherein expression (8) is obtained by differentiating expression (6) with respect to Z.

$$(P/(Z_O \cdot V_g)) \cdot (dV_z/dZ) = 2 \cdot \beta \cdot \sin \beta \cdot (L_E - Z) = 0 \quad (8)$$

From expression (8), the point Z on the cable where the voltage $V_z$ takes the extreme value is calculated using the following expression.

$$\beta \cdot (L_E - Z) = (2\pi/\lambda) \cdot (L_E - Z) = (N-1) \cdot \pi \quad (9)$$

The result is as follows.

$$Z = L_E - (\lambda/2) \cdot (N-1) \ (N \text{ is an integer}) \quad (10)$$

Here, as the boundary condition for the voltage $V_z$, the condition is set in which the load-end voltage $V_L(V_z(z=L_E))$ of the load end of the cable becomes the maximum voltage value. For example, this boundary condition corresponds to the case in which the electrical length $L_E$ of the cable is an odd multiple of a quarter wavelength. The electrical length $L_E$ of the cable satisfying this condition can be selected by expression (11) given below.

$$L_E = (2n-1) \cdot (\lambda/4) \quad (11)$$

When the cable length $L_w$ is selected so that the electrical length $L_E$, corresponding to the cable length $L_w$, becomes a length satisfying expression (11) given above, the voltage $V_z$ at a given point Z ($0 \leq Z \leq L_w$) on the cable may be obtained by the following expression (12) by substituting expression (11) in expression (10).

$$Z = (\lambda/2) \cdot (n - N + 1) - \lambda/4 \quad (12)$$

The voltage $V_z$ at the point Z at this time may be obtained by substituting expression (12) in expression (6).

In one example, the electrical length $L_E$ of the cable for n=1, 2, and 3 becomes $\lambda/4$, $3\lambda/4$, and $5\lambda/4$, respectively. This indicates that, for a cable whose cable length is the electrical length $L_E$, the voltage $V_z$ at the positions $\lambda/4$, $3\lambda/4$, and $5\lambda/4$ from the RF generator unit side reaches the maximum value.

For example, because the position of $Z=5\lambda/4$ corresponds to the point on the load side ($Z=L_w$) of the cable length $L_w$, $\beta \cdot L_w$ is calculated as $\beta \cdot L_w = (2 \cdot \pi/\lambda) \cdot (5 \cdot \lambda/4) = 5 \cdot \pi/2$ and P in expression (7) becomes ($j \cdot Z_g$). Therefore, from expressions (6) and (7), the load-end voltage $V_L(V_z(z=L_E))$ is obtained by the following expression (13).

$$V_L = (Z_O \cdot V_g) / \{(Z_O \cdot \cos(\beta \cdot L_E) + j(Z_g \cdot \sin(\beta \cdot L_E))\} = -j(Z_O/Z_g) \cdot V_g \quad (13)$$

When the load end is in the open state, the relation $\beta L_E = (2\pi/\lambda) \cdot L_E$ is applied in expressions (6) and (7) for rewriting. Then, the load-end voltage ($V_z(z=L_E)$) at $Z=L_E$ is represented by expression (14) given below.

$$|V_z| = (Z_O \cdot V_g) / \{(Z_O^2 - Z_g^2) \cdot \cos^2 \cdot (2\pi/\lambda) \cdot L_E + Z_g^2\}^{1/2} \quad (14)$$

The electrical length $L_E$ of the cable when the load-end voltage $|V_z(z=L_E)|$ is the K times of the RF generator voltage $|V_g|$ may be obtained based on the relation between the load-end voltage $V_z$ and the RF generator voltage $V_g$ when $Z=L_E$.

When the load-end voltage $|(V_z(z=L_E))|$ is the K times of the RF generator voltage $|V_g|$, the load-end voltage $|(V_z(z=L_E))|$ is represented by the following expression (15).

$$|(V_z(z=L_E))| = K|V_g| \ (K \geq 1) \quad (15)$$

From expression (15), the following expression is obtained.

$$(\cos^2(2\pi/\lambda)) \cdot L_E = (Z_O^2/K^2 - Z_g^2)/(Z_O^2 - Z_g^2) \quad (16)$$

Expression (16) is satisfied under the condition $K \geq 1$.

Because "$\cos^2(2\pi/\lambda) \cdot L_E$" is approximated to 1 when $K=\infty$ in expression (16), the multiplying factor K may be approximated by expression (17) given below.

$$K = |Z_o/Z_g| \quad (17)$$

If $Z_g/Z_o$ can be approximated to "0" in the relation between the characteristic impedance $Z_o$ and the internal impedance $Z_g$ in expression (17) above, $\cos\{(2\pi/\lambda) \cdot L_E\}$ may be approximated to "1/K". At this time, from expression (17), the electrical length $L_E$ can be represented by the following approximation expression in expression (18).

$$L_E \approx \{\cos^{-1}(1/K)/(2 \cdot \pi)\} \cdot \lambda \quad (18)$$

Here, the difference $k \cdot \lambda$ between the electrical length $L_E$, where the load-end voltage $|(V_z(z=L_E))|$ is the K times of the RF generator voltage $|V_g|$, and the electrical length $L_E = (2n-1) \cdot \lambda/4$, where the load-end voltage $|(V_z(z=L_E))|$ is maximized, is represented by expression (19) given below.

$$k \cdot \lambda = [\{\pi - 2 \cdot \cos^{-1}(1/K)\}/(4\pi)] \cdot \lambda \quad (19)$$

Therefore, the range of the electrical length $L_E$, which satisfies $|V_z| \geq K \cdot |V_g|$, is represented by expression (20) given below.

$$(2n-1) \cdot (\lambda/4) - k \cdot \lambda \leq L_E \leq (2n-1) \cdot (\lambda/4) + k \cdot \lambda \quad (20)$$

Figure 6:
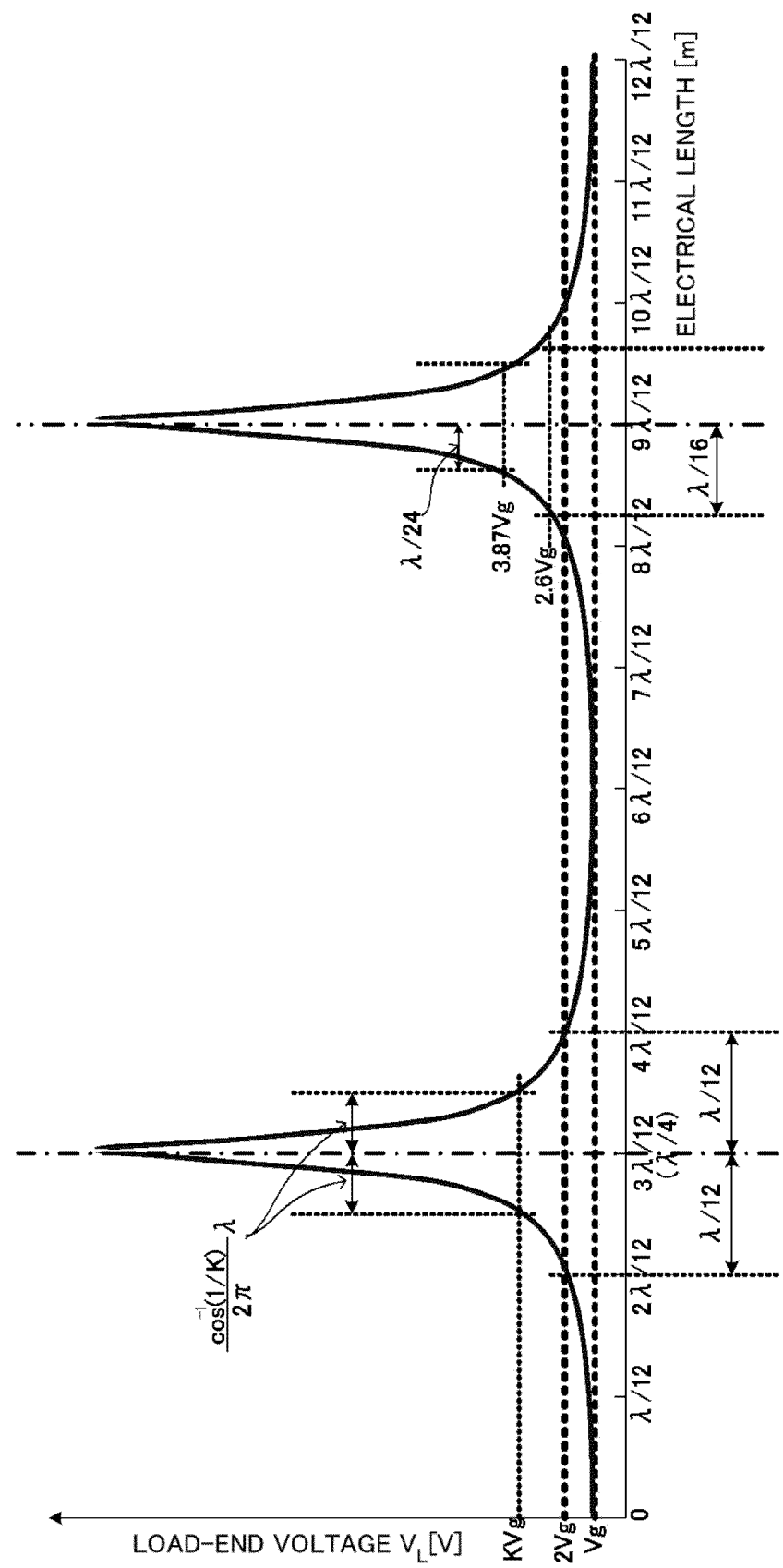
FIG. 6 is a diagram showing the relation between the electrical length $L_E$ and the load-end voltage ($V_z(z=L_E)$) of the present invention.

FIG. 6 shows the relation among the electrical length $L_E$ when the load-end voltage $|(V_z(z=L_E))|$ is infinite (expression (11)), the electrical length $L_E$ when the load-end voltage $|(V_z(z=L_E))|$ is the K times of the RF generator voltage $|V_g|$ (expression (19)), and the range of the electrical length $L_E$ that satisfies $|(V_z(z=L_E))| \geq K \cdot |V_g|$ (expression 20). The range of the electrical length $L_E$ that satisfies $|(V_z(z=L_E))| \geq K \cdot |V_g|$ in FIG. 6 is shown in the following two cases: $|(V_z(z=L_E))| = |V_g|$ when the multiplying factor K is 1 and $|(V_z(z=L_E))| = 2|V_g|$ when the multiplying factor K is 2. Although FIG. 6 shows only the range 0-λ, the same applies to the electrical length $L_E$ equal to or larger than λ.

Referring to FIG. 6, the load-end voltage $|(V_z(z=L_E))|$ is maximized when the electrical length $L_E$ is λ/4 and 3λ/4, and the load-end voltage $|(V_z(z=L_E))|$ becomes $K|V_g|$ when the electrical length $L_E$ is "(2n−1)·(λ/4)−k·λ" and "(2n−1)·(λ/4)+k·λ".

Figure 7:
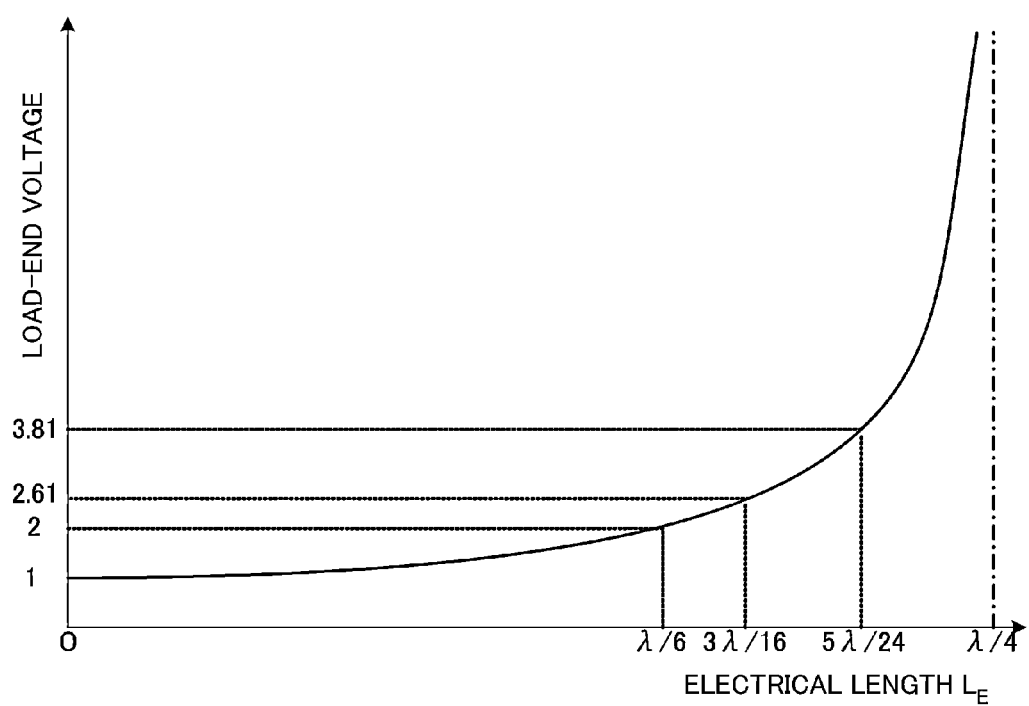
FIG. 7 is a diagram showing the relation between the electrical length $L_E$ and the K times of the RF generator voltage $|V_g|$ of the present invention.

Table 1 and FIGS. 6 and 7 show examples when the value of K is K=1, 2, 2.61, and 3.87 respectively. Note that the values of K are selected from convenience of calculation and that those values have no significant meaning in this application of the invention.

TABLE 1

| K | k·λ | Electrical length $L_E$ | Range of cable length $L_w$ | |
|---|---|---|---|---|
| 1 | λ/4 (5.53 m) | 0 ≤ $L_E$ ≤ λ/2 | 0 < 5.53 m < 11.06 m | 11.06 m < 16.59 m < 22.12 m |
| 2 | λ/12 (1.84 m) | λ/6 ≤ $L_E$ ≤ λ/3 | 3.69 m < 5.53 m < 7.37 m | 14.75 m < 16.59 m < 18.43 m |
| 2.61 | λ/16 (1.38 m) | 3λ/16 ≤ $L_E$ ≤ 5λ/16 | 4.1 m < 5.53 m < 6.91 m | 15.21 m < 16.59 m < 17.97 m |
| 3.87 | λ/24 (0.92 m) | 5λ/24 ≤ $L_E$ ≤ 7λ/24 | 4.6 m < 5.53 m < 6.45 m | 15.67 m < 16.59 m < 17.59 m |

In the case of K=1: When K=1, k·λ=λ/4. The range of the electrical length $L_E$ that satisfies $|V_z| \geq |V_g|$ is $0 \leq L_E \leq \lambda/4$ and $\lambda/4 \leq L_E \leq 2\lambda/4$.

At this time, when the AC frequency f is 13.5 MHz, the cable length $L_w$ corresponding to the maximum load-end voltage $|(V_z(z=L_E))|$ is 5.53 m. The range of the cable length $L_w$ in which the load-end voltage $|(V_z(z=L_E))|$ is higher than the RF generator voltage $|V_g|$ is $0 \leq L_w \leq 11.06$ m and $11.06$ m $\leq L_w \leq 22.12$ m.

In the case of K=2: When K=2, k·λ=λ/12. The range of the electrical length $L_E$ that satisfies $|(V_z(z=L_E))| \geq 2|V_g|$ is $\lambda/6 \leq L_E \leq \lambda/3$ and $2\lambda/3 \leq L_E \leq 5\lambda/6$.

At this time, when the AC frequency f is 13.5 MHz, the cable length $L_w$ corresponding to the maximum load-end voltage $|V_z|$ is 5.53 m. The range of the cable length $L_w$ in which the load-end voltage $|(V_z(z=L_E))|$ is higher than the RF generator voltage $2|V_g|$ is 3.69 m $\leq L_w \leq$ 7.37 m and 14.75 m $\leq L_w \leq$ 18.43 m.

In the case of K=2.61: When K=2.61, k·λ=λ/16. The range of the electrical length $L_E$ that satisfies $|(V_z(z=L_E))| \geq 2.61|V_g|$ is $3\lambda/16 \leq L_E \leq 5\lambda/16$ and $11\lambda/16 \leq L_E \leq 13\lambda/16$.

At this time, when the AC frequency f is 13.5 MHz, the cable length $L_w$ corresponding to the maximum load-end voltage $|(V_z(z=L_E))|$ is 5.53 m. The range of the cable length $L_w$ in which the load-end voltage $|(V_z(z=L_E))|$ is higher than the RF generator voltage $2.61|V_g|$ is 4.1 m $\leq L_w \leq$ 6.91 m and 15.21 m $\leq L_w \leq$ 17.97 m.

In the case of K=3.87: When K=3.87, k·λ=λ/24. The range of the electrical length $L_E$ that satisfies $|(V_z(z=L_E))| \geq 3.87|V_g|$ is $5\lambda/24 \leq L_E \leq 7\lambda/24$ and $17\lambda/24 \leq L_E \leq 19\lambda/24$.

At this time, when the AC frequency f is 13.5 MHz, the cable length $L_w$ corresponding to the maximum load-end voltage $|(V_z(z=L_E))|$ is 5.53 m. The range of the cable length $L_w$ in which the load-end voltage $|(V_z(z=L_E))|$ is higher than the RF generator voltage $3.87|V_g|$ is 4.6 m $\leq L_w \leq$ 6.45 m and 15.67 m $\leq L_w \leq$ 17.59 m.

Although the internal impedance $Z_g$ described above is $Z_g$=0, the internal impedance of the actual RF generator has a small resistance of about 2 [ohm] because of the on-resistance of the semiconductor switch that configures the RF amplifier circuit. Even when the internal impedance has a small resistance as described above, the internal impedance $Z_g$ may be considered as $Z_g$=0 if the internal impedance $Z_g$ is sufficiently small as compared to the characteristic impedance $Z_o$.

For example, when K=2, expression (14), which indicates the relation between $|(V_z(z=L_E))|$ and $K|V_g|$ when $Z_g$=0, becomes expression (21) given below.

$$|(V_z(z=L_E))|=V_g/|\cos(2\pi/\lambda)\cdot L_E|=2V_g \quad (21)$$

On the other hand, when $Z_g$=2 [ohm] and $Z_o$=50 [ohm], expression (14), which indicates the relation between $|(V_z(z=L_E))|$ and $K|V_g|$, becomes expression (22) given below.

$$|(V_z(z=L_E))|=50\cdot V_g/\{(50^2-2^2)\cdot\cos^2(2\pi/\lambda)\cdot L_E+2^2\}^{1/2} \approx V_g/|\cos(2\pi/\lambda)\cdot L_E|=2V_g \quad (22)$$

Therefore, expression (21) when $Z_g$=0 is approximately equivalent to expression (22) when $Z_g$=2 [ohm] and $Z_o$=50 [ohm].

That the load-end voltage $|(V_z(z=L_E))|$, obtained when $Z_g$=2 [ohm] and $Z_o$=50 [ohm], is approximately equal to the load-end voltage $|(V_z(z=L_E))|$, obtained when $Z_g$=0, can be confirmed by the fact that $|(V_z(z=L_E))|$, which is obtained by applying the electrical length $L_E$=λ/6, $Z_g$=2 [ohm], and $Z_o$=50 [ohm], obtained by expression (21), to expression (22), is $1.99V_g$.

When the electrical length $L_E$ of the transmission line of the power supply unit (coaxial cable) is selected to be (2n−1)·(λ/4), an odd multiple of λ/4, at the time the load end is in the open state and the impedance $Z_L$ at the load end is infinite, the impedance $Z_{in}$, viewed from the RF generator unit 1 to the load side is, "0". Setting the impedance $Z_{in}$ to "0" allows the power, supplied from the RF generator unit to the load side, to be maximized.

Therefore, when the internal impedance $Z_g$ of the RF generator is considered sufficiently small as compared to the characteristic impedance $Z_o$, increasing the value of $Z_o/Z_g$, shown in expression (13), can increase the load-end voltage $V_z$ in proportion to the value. When the plasma is in the non-ignition state in the plasma load and the load impedance is considered infinite, the allowable range of the cable length may be increased to a range higher side or lower side of (2n−1)·(λ/4) at which the maximum voltage $V_L(V_z(z=L_E))$ is generated. That is, the electrical length $L_E$ of the transmission line of the power supply unit (coaxial cable) may be increased to the range (2n−1)·(λ/4)−k·λ ≤ $L_E$ ≤ (2n−1)·(λ/4)+k·λ to increase the load-end voltage. In the description above, n is an integer, k·λ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

The condition for the fundamental wavelength λ, satisfactory for the electrical length $L_E$ of the transmission line, is a value at which the ignition voltage becomes equal to or higher than about the twice ($2V_g$) of the RF generator voltage $V_g$. "k·λ" shown in the allowable range described above is an example of the electrical length range in which a voltage, higher than the load-end voltage provided by the class C RF generator, can be obtained wherein, in the class C RF generator, the internal impedance $Z_g$ of the RF generator device is impedance-matched with impedance $Z_{in}$ viewed from the generator to the load side.

An RF generator, such as the class D RF generator, in which the internal impedance $Z_g$ of the RF generator is considered sufficiently lower than the characteristic impedance $Z_o$, can supply a large current as compared to the class C RF generator by setting the electrical length $L_E$ of the transmission line of the power supply unit (coaxial cable) to $(2n-1)\cdot(\lambda/4)-k\cdot\lambda \leq L_E \leq (2n-1)\cdot(\lambda/4)+k\cdot\lambda$. This is because the voltage $V_L$ of the load-end voltage is increased as shown in expression (13). In the description above, n is an integer, k·λ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

The electrical length $L_E$ of the transmission line of the power supply unit may be selected in one of the following three ways: (1) the electrical length $L_E$ is selected so that the distribution-constant-based electrical length $L_E$ becomes $(2n-1)\cdot(\lambda/4)-k\cdot\lambda \leq L_E \leq (2n-1)\cdot(\lambda/4)+k\cdot\lambda$ according to the cable length of the feed cable, (2) the electrical length $L_E$ is selected so that the concentrated-constant-based electrical length $L_E$ becomes $(2n-1)\cdot(\lambda/4)-k\cdot\lambda \leq L_E \leq (2n-1)\cdot(\lambda/4)+k\cdot\lambda$ according to the values of the capacitor device and the reactor device of the filter circuit, and (3) the electrical length $L_E$ is selected according to the combination of the cable length and the values of the devices in the filter circuit. In the description above, n is an integer, k·λ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

FIG. 5B is a diagram showing an example of the configuration in which the feed cable 4a is used as the power supply unit 4 and the electrical length $L_E$ is selected as $(2n-1)\cdot(\lambda/4)-k\cdot\lambda \leq L_E \leq (2n-1)\cdot(\lambda/4)+k\cdot\lambda$ according to the cable length. FIG. 5C is a diagram showing an example of the configuration in which the filter circuit 4b is used as the power supply unit 4 and the electrical length $L_E$ is selected as $(2n-1)\cdot(\lambda/4)-k\cdot\lambda \leq L_E \leq (2n-1)\cdot(\lambda/4)+k\cdot\lambda$ according to the values of the capacitor device and the reactor device. FIG. 5D is a diagram showing an example of the configuration in which the feed cable 4a and the filter circuit 4b are used as the power supply unit 4 and the electrical length $L_E$ is selected as $(2n-1)\cdot(\lambda/4)-k\cdot\lambda \leq L_E \leq (2n-1)(\lambda/4)+k\cdot\lambda$ according to the cable length and the values of the capacitor device and the reactor device. In the description above, n is an integer, k·λ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

Figure 8:
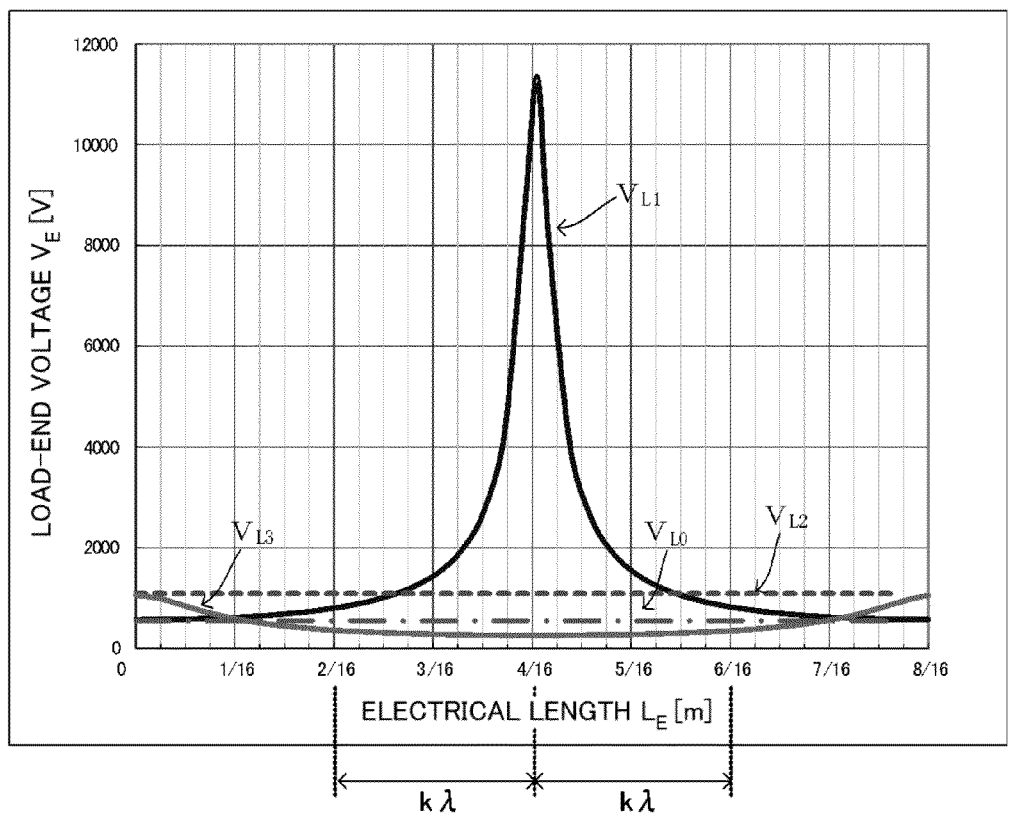
FIG. 8 is a diagram showing an embodiment of the present invention.

FIG. 8 compares between the embodiment of the present invention and a conventional class C RF generator and shows the load-end voltage $V_L$ when a reflected wave power is generated. The horizontal axis in FIG. 8 indicates the electrical length (cable length). In this case, the load-end voltage $V_L(V_z(z=L_E))$ may be obtained by substituting $z=L_E$ in expression (4) given above.

The conditional expressions in FIG. 8 are shown in Table 2 below.

TABLE 2

| | |
|---|---|
| Common condition | $Z_g$: Constant $Z_g$ is selected so that rated output of 3 kW is output when $Z_L = 50$[ohm] $V_L$: Voltage is measured using constant $Z_g$ with VSWR = 100:1 ($Z_L = 5000$[ohm]) $L_u = 250$[nH/m] $C_u = 100$[pF/m] $Z_o = 50$[ohm] |
| Condition for class D RF amplifier circuit $V_{L1}$ | $V_g = 570$[Vp], $Z_g = 2$[ohm] |
| Condition for class C RF amplifier circuit $V_{L2}$ | $V_g = 1100$[Vp], $Z_g = 50$[ohm] (when 100% of reflected wave power tolerance is assumed) |
| Condition for class C RF amplifier circuit $V_{L3}$ | $V_g = 1100$[Vp], $Z_g = 210$[ohm] (when 15%(450 W) of reflected wave power tolerance is assumed) |

In this example, to compare load-end voltages in the plasma non-discharge state, the voltage-standing-wave-ratio (VSWR) is set to 100 in the plasma non-discharge state.

As the condition common to the class D RF generator, applied to the present invention, and to the conventionally used class C RF generator with which the class D RF generator is compared, the following are assumed. That is, the constant $Z_g$ of the internal impedance is selected so that the rated output of 3 kw is output when the load impedance $Z_L=50$ [ohm]. The load-end voltage $V_L$ is measured using this constant $Z_g$ with the load resistance $Z_L(V_z(z=L_E)=5000$ [ohm] and with the voltage-standing-wave-ratio (VSWR) set to 100:1. Note that the voltage- standing-wave-ratio (VSWR)=100:1 corresponds to the state in which the load side is open (open state) and before plasma is ignited. The characteristic impedance $Z_o$ is assumed 50 [ohm]

As the condition for the class D RF generator of the present invention, the RF generator voltage $V_g$ is set to 570 [Vp] (peak to ground voltage) and the internal impedance $Z_g$ is set to 2 [ohm] with the load-end voltage represented as $V_{L1}$.

As the condition for the conventional class C RF generator, two examples are set. In one example, the RF generator voltage $V_g$ is set to 1100 [Vp] (peak to ground voltage) and the internal impedance $Z_g$ is set to 50 [ohm], with the load-end voltage represented as $V_{L2}$. In the other example, the RF generator voltage $V_g$ is set to 1100 [Vp] (peak to ground voltage) and the internal impedance $Z_g$ is set to 210 [ohm] with the load-end voltage represented as $V_{L3}$.

The load-end voltage $V_{L2}$ is an example in which it is assumed that, in the state where the reflected wave is 100% and so self-oscillation would usually be generated, 100% of reflected wave power tolerance is implemented. The load-end power $V_{L3}$ is an example in which it is assumed that the dropping protection is performed and the reflected wave power tolerance is 15% (corresponding to 450 W). The load-end voltage $V_{L0}$ is an example in which the load impedance $Z_L=50$ [ohm] and the RF generator and the load are impedance matched.

Referring to FIG. 8, the load-end voltage $V_{L0}$ is constant regardless of the electrical length of the feed cable because the RF generator and the load are impedance matched. The load-end voltage $V_{L2}$ indicates the reflected wave power tolerance is 100% in the class C generator. Although self-oscillation usually occurs when the reflected wave power tolerance is 100%, the load-end voltage $V_{L2}$ indicates that a power generator that does not cause self-oscillation is assumed to be implemented. In this case, the voltage is the twice ($2V_{L0}$) of the load-end voltage $V_{L0}$.

An actual RF generator is designed to have an allowable reflected wave power tolerance that is 15%-20% of the rated power. Therefore, the load-end voltage that can be output by the class C RF generator is usually set to $V_{L3}$ by the dropping protection operation.

In the class C RF generator, the load-end voltage is $V_{L3}$ because the internal impedance $Z_g$ is increased when the class C RF generator is operated at a power lower than the rated power. Because the current is limited by the internal impedance $Z_g$ in this case, the load-end voltage is twice of $V_{L0}$, which is the output by 50 [ohm] matching, at the highest.

On the other hand, because the class D RF generator to which the present invention is applied allows 100% of reflected wave power, the load-end voltage is $V_{L1}$ and the load-end voltage when the electrical length is $\lambda/4$ is $V_{L1}$=11334 [Vp]. The comparison between this load-end voltage $V_{L1}$ and the load-end voltage $V_{L2}$=1055 [Vp] of the class C RF generator indicates that 11334/1055 is nearly equal to 10.7 times, thus increasing the load-end voltage.

When VSWR=∞, the load-end voltage $V_{L1}$ is calculated from expression (13). Under the condition of $V_{L1}$ shown in Table 2, the value is calculated as $V_{L1}=(Z_o/Z_g)\cdot V_g=(50/2)\cdot 570=14,250$[VP].

By applying the present invention to a plasma load, the length of the feed cable is selected so that the electrical length $L_E$ when the load end is in the open state becomes $(2n-1)\cdot(\lambda/4)-k\cdot\lambda \leq L_E \leq (2n-1)\cdot(\lambda/4)+k\cdot\lambda$ (n is an integer) with respect to the fundamental wavelength $\lambda$ of the RF AC. The length of the feed cable, if selected in this way, enables high voltage to be applied to the load end before plasma is ignited, making it easy to ignite the plasma load. The range of this electrical length $L_E$ is selected as $(2n-1)\cdot(\lambda/4)-k\cdot\lambda \leq L_E \leq (2n-1)\cdot(\lambda/4)+k\cdot\lambda$ (n is an integer) in which $V_{L1}$ is higher than $V_{L3}$ in voltage in FIG. 8. In the description above, n is an integer, $k\cdot\lambda$ represents the range of the electrical length $L_E$ in which the load-end voltage ($V_z(z=L_E)$) becomes equal to or higher than the voltage that is set, and the constant k, which means that the load-end voltage ($V_z(z=L_E)$) is the K times of the RF generator voltage $V_g$, is represented as "$\{\pi-2\cdot\cos^{-1}(1/K)\}/(4\pi)$".

Although the internal impedance $Z_g$ is denoted only by the resistance R in this example, the imaginary number part may also be included as in $Z_g = R \pm jX$.

Referring to FIG. 9, the following describes the ignition operation in the plasma load by comparing the ignition operation of the present invention with that of the conventional class C RF generator. FIG. 9A to FIG. 9D and FIG. 9E to FIG. 9H show the forward wave power, reflected wave power, generator output voltage, and load-end voltage in the ignition operation of the RF generator of the present invention and those of the conventional class C RF generator, respectively. In the examples in FIG. 9, the control signal rises at T1 and falls at T2.

Figure 9A:
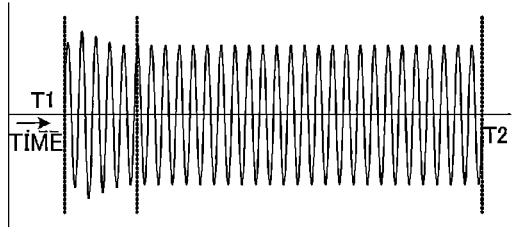
FIG. 9 is a diagram showing the ignition operation of the present invention and the dropping operation in a conventional configuration.
Figure 9B:
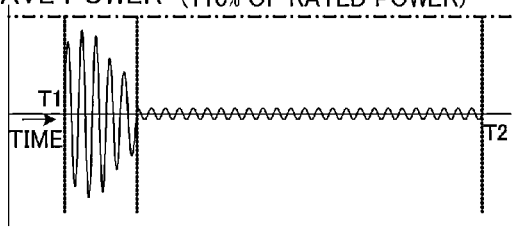
Figure 9C:
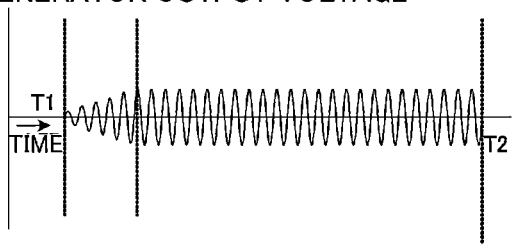
Figure 9D:
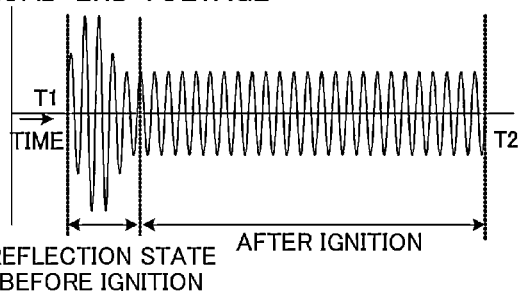
Figure 9E:
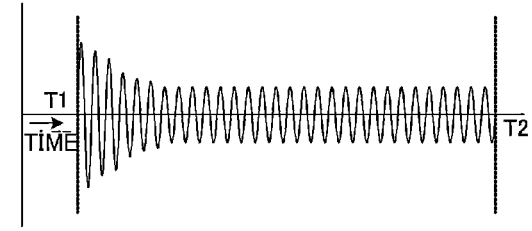
Figure 9F:
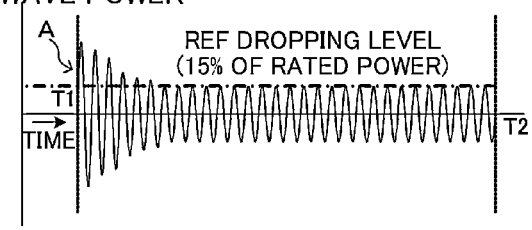
Figure 9G:
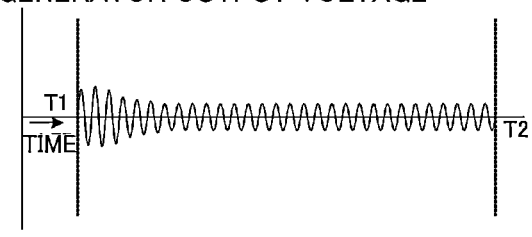
Figure 9H:
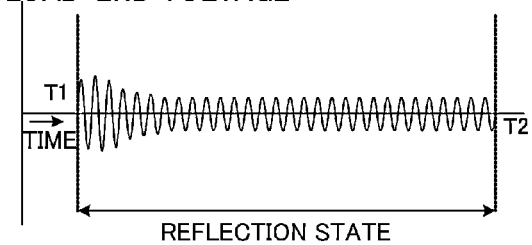

According to the conventional class C RF generator, the reflected wave power increases at the same time the control signal rises and exceeds the REF dropping level (which is set, for example, to 15% of rated output) (FIG. 9F). When the reflected wave power exceeds the dropping level, the dropping operation is started and the generator output voltage and the forward wave power are limited (FIGS. 9G, 9E). When the forward wave power is limited, the load-end voltage does not reach a voltage required for plasma ignition and, therefore, the ignition fails (FIG. 9H).

On the other hand, the reflected wave power dropping level can be set to 100% of the rated output according to the present invention. This setting prevents the reflected wave power (FIG. 9B), which increases as the control signal rises, from exceeding the REF dropping level, and the dropping operation is not started. Therefore, the forward wave power (FIG. 9A) is not limited but maintains the generator output voltage (FIG. 9C). Thus, the load-end voltage (FIG. 9D) reaches the ignition level, and the plasma is ignited.

Figure 10A:
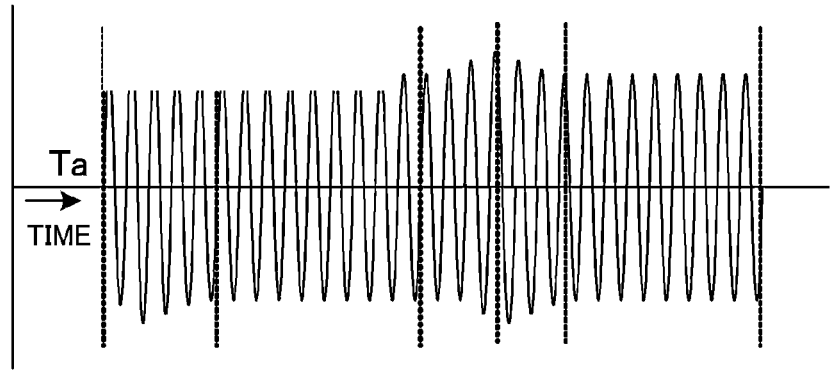
FIG. 10 is a diagram showing the re-ignition operation of a plasma load.
Figure 10B:
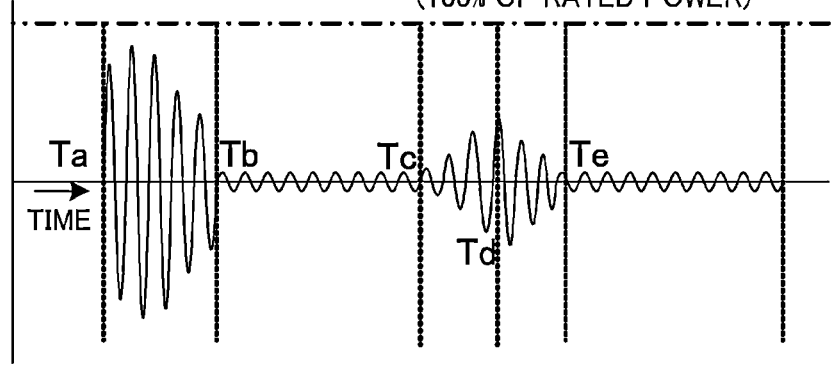
Figure 10C:
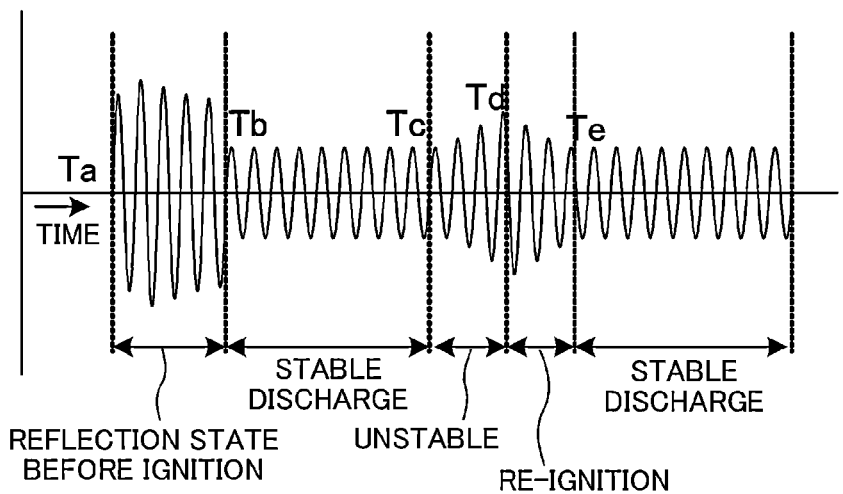
Figure 11:
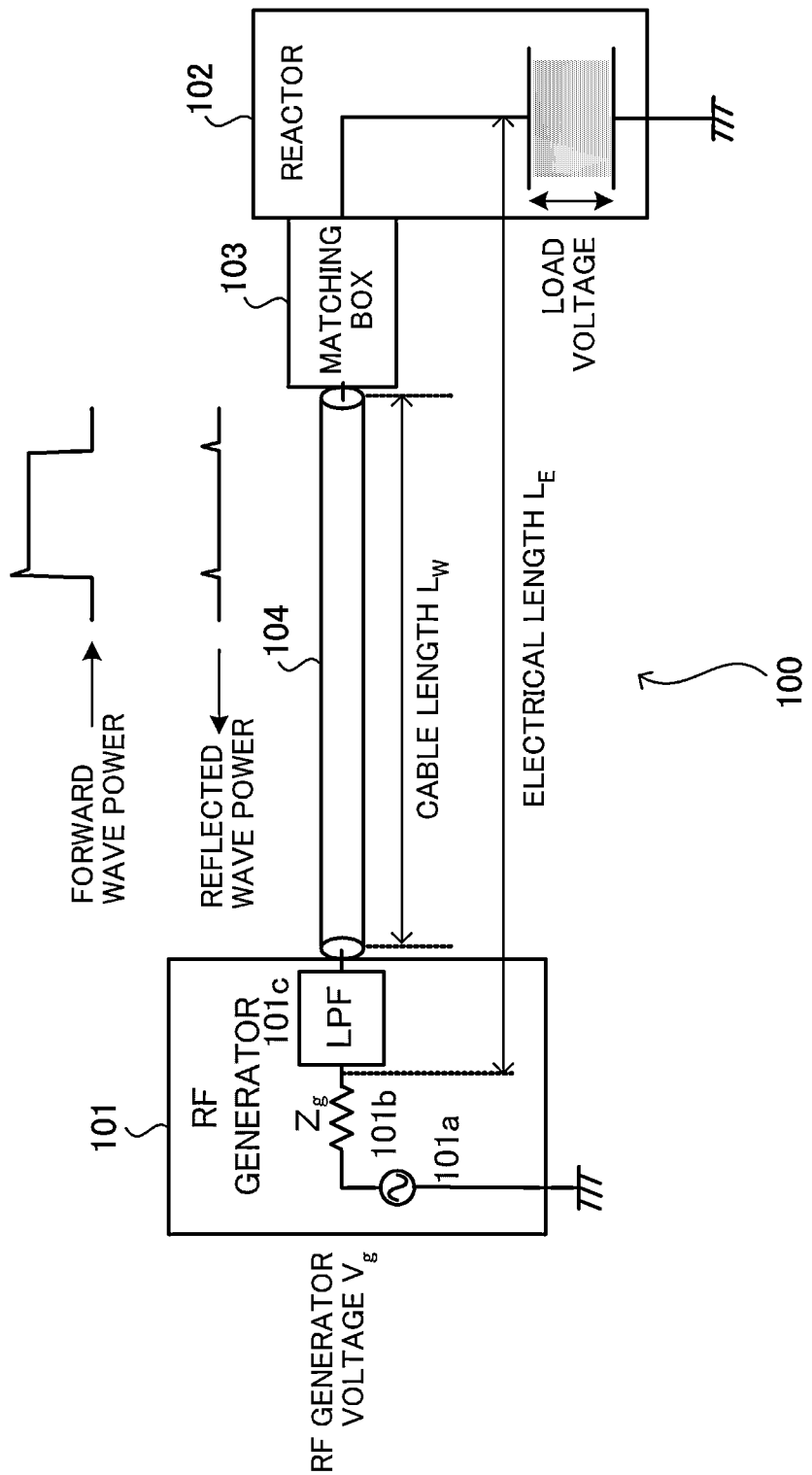
FIG. 11 is a diagram showing an example of one configuration of a plasma treatment device.
Figure 12:
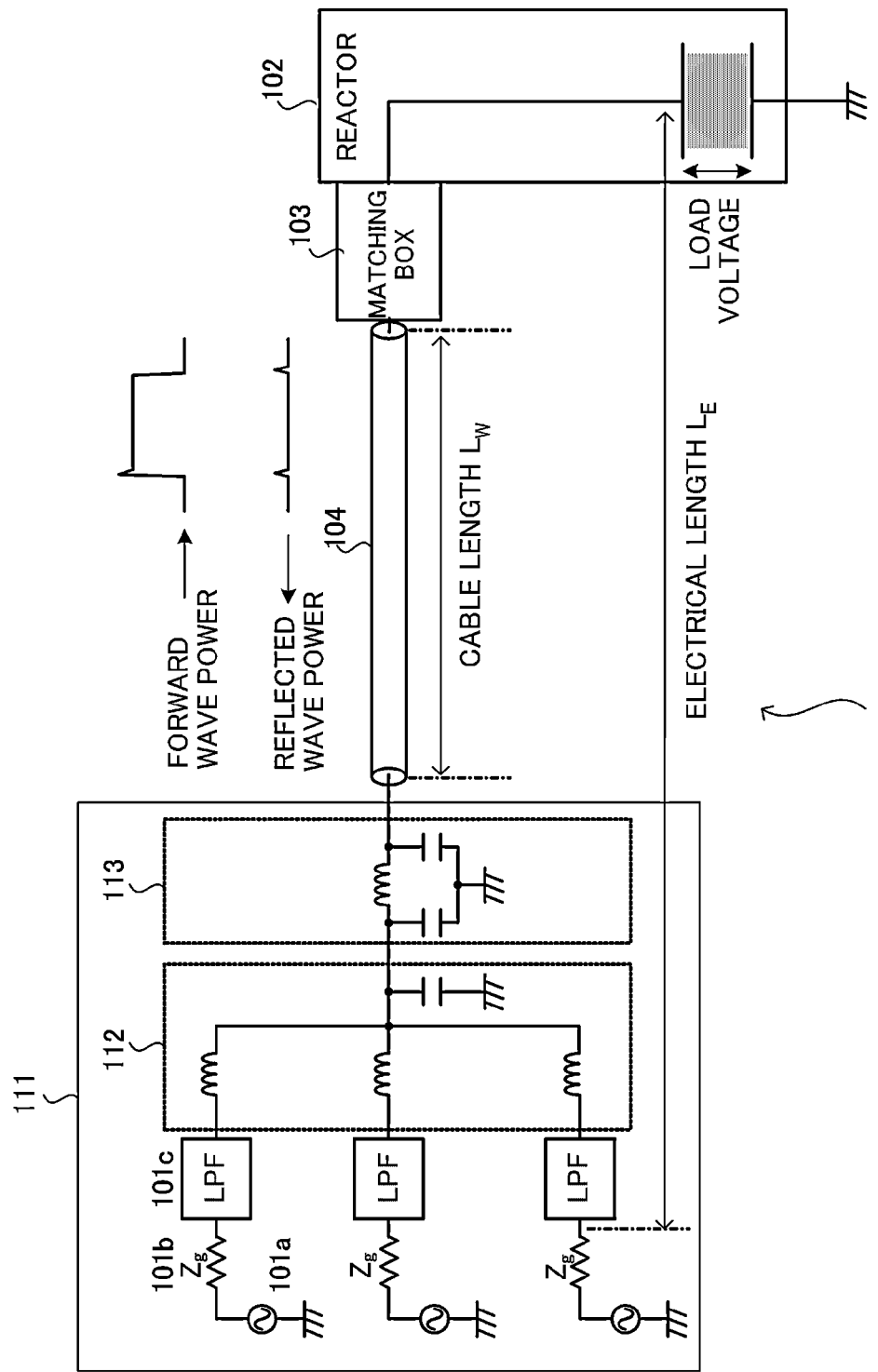
FIG. 12 is a diagram showing an example of one configuration of a plasma treatment device.
Figure 13:
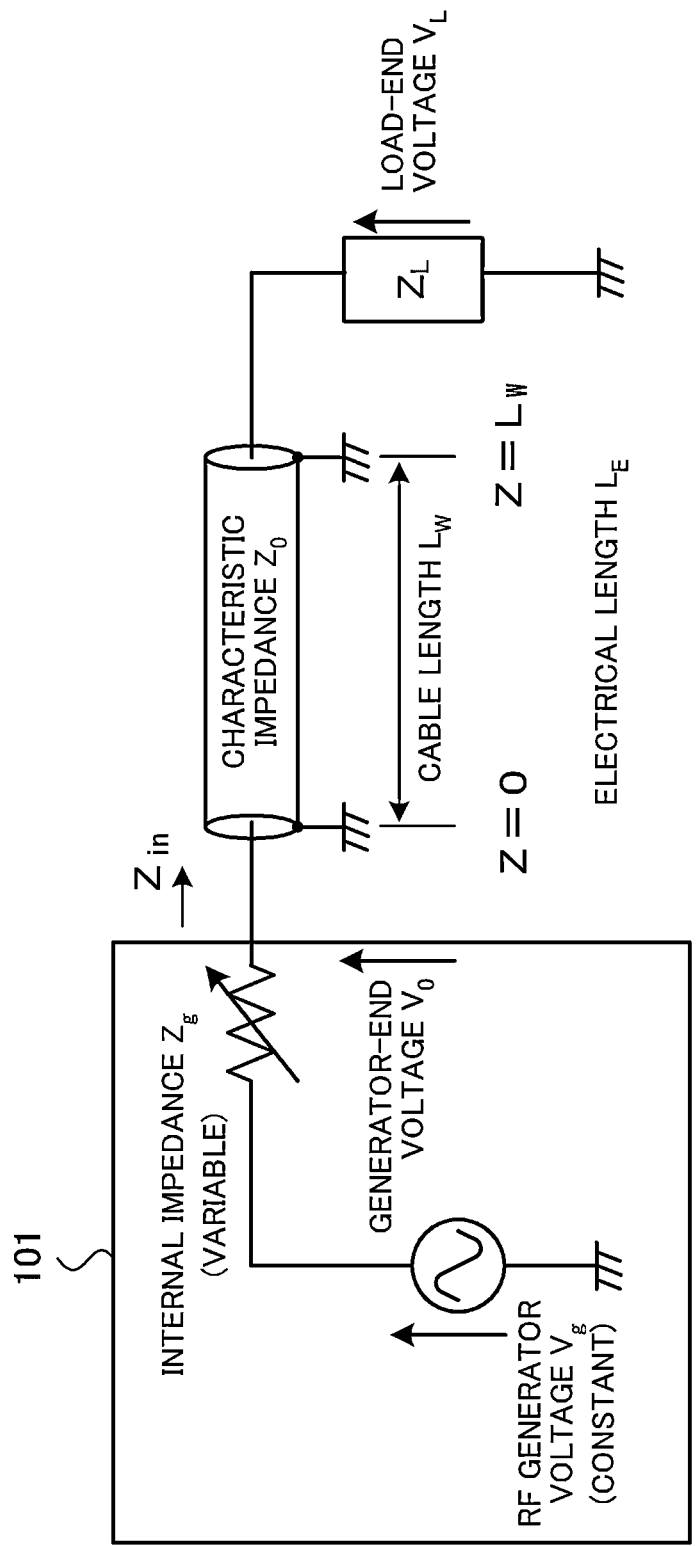
FIG. 13 is a diagram showing an equivalent circuit of a class C RF generator.

In addition, the present invention also achieves the effect of maintaining plasma. The re-ignition operation for the plasma load is described with reference to FIG. 10. FIG. 10A to FIG. 10C show the forward wave power, reflected wave power, and load-end voltage respectively in the re-ignition operation of the present invention. In FIG. 10, Ta indicates the time when the control signal rises and the ignition operation is started, Tb indicates the time when plasma is ignited and becomes stable, Tc indicates the time when the discharge becomes unstable, Td indicates the time when the re-ignition operation is started, and Te indicates the time when plasma is re-ignited and becomes stable, respectively.

When plasma moves from the stable discharge to the unstable discharge at time Tc, the reflected wave power is increased (FIG. 10B). As the reflected wave power is increased, the load-end voltage is increased, the re-ignition operation is started at time Td, and stably discharged plasma is maintained beginning at time Te (FIG. 10C).

This re-ignition operation can be performed by selecting an electrical length, which increases the load-end voltage, according to the present invention when the electrical length of the feed cable is selected.

As an amplifier circuit for performing the switching operation of the RF power amplifier device, not only the class D amplifier circuit but also the class E amplifier circuit is known. This class E amplifier, which uses a resonant circuit, sometimes resonates with the characteristic impedance of the feed cable. The voltage, applied to the RF power amplifier device by the reflected wave power generated at resonance time, exceeds four to ten times of the generator power and, therefore, there is a possibility that the voltage may destroy the RF power amplifier device.

Thus, if the class E amplifier is used as the RF generator unit to implement the present invention, it is necessary to add a configuration for preventing the reflected wave power from destroying the RF power amplifier device.

The description of the embodiments and modifications described above are an example of the RF power supplying device and the ignition voltage selection method of the present invention. It is to be understood that the present invention is not limited to the embodiments but may be modified in various ways based on the spirit of the present invention and that those modifications are included in the scope of the present invention.

INDUSTRIAL APPLICABILITY

The RF power supplying device of the present invention is applicable as a power supply that supplies power to a plasma generation device. The ignition voltage selection method is applicable to the selection of the load-end voltage when power is supplied to a plasma generation device.

DESCRIPTION OF REFERENCE NUMERALS

RF generator unit
1a DC power supply
1b Inverter circuit

1c Filter circuit
2 Load
3 Impedance matching box
4 Power supply unit
4a Feed cable
4b Filter circuit
4c Series circuit
10 RF power supplying device
100 Plasma treatment device
101 RF generator
101a Generator voltage
101b Internal impedance
101c Low-pass filter
102 Reactor
103 Impedance matching box
104 Feed cable
111 RF generator
112 Combiner
113 Low-pass filter
120 Power amplifier circuit
120a,b,c,d MOSFET
120e Main transformer
120f Filter
A, A* Gate signal
B, B* Gate signal

The invention claimed is:

1. An RF power supplying device comprising:
an RF generator unit that converts a DC of a DC power supply to an RF AC through a switching operation; and
a power supply unit connected between an output end of said RF generator unit and a load end, which is an input end of a load, to supply the RF AC to the load, wherein
an internal impedance of said RF generator unit is lower than a characteristic impedance of said power supply, and
an electrical length ($L_E$) of said power supply unit when the load end is in an open state is a value selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to a fundamental wavelength $\lambda$ of the RF AC.

2. The RF power supplying device according to claim 1 wherein,
said power supply unit is a feed cable that electrically connects between the output end of said RF generator unit and the load end of said load,
the internal impedance of said RF generator unit is lower than a characteristic impedance of said feed cable, and
an electrical length $L_E$ of a cable length of said feed cable when the load end of said load is in an open state is a length in electrical length selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to the fundamental wavelength $\lambda$ of the RF AC.

3. The RF power supplying device according to claim 1 wherein,
said power supply unit is a filter circuit that electrically connects between the output end of said RF generator unit and the load end of said load, the filter circuit being a series resonant circuit of a capacitor and a reactor,
the internal impedance of said RF generator unit is lower than the characteristic impedance of said filter circuit, and
an electrical length $L_E$ of said filter circuit when the load end is in an open state is an electrical length selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to the fundamental wavelength $\lambda$ of the RF AC.

4. The RF power supplying device according to claim 1 wherein,
said power supply unit is a series circuit that electrically connects between the output end of said RF generator unit and the load end of said load, the series circuit including a filter circuit and a feed cable, the filter circuit being a circuit of a capacitor and a reactor,
the internal impedance of said RF generator unit is lower than the characteristic impedance of said series circuit, and
an electrical length $L_E$ of said series circuit when the load end is in an open state is an electrical length selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to the fundamental wavelength $\lambda$ of the RF AC.

5. The RF power supplying device according to claim 1 wherein,
the constant k is $\{\pi-2\cdot\cos^{-1}(1/K)\}/(4\pi)$ and is a constant defining a range of an electrical length $L_E$ that makes a load-end voltage ($V_z(z=L_E)$) the K times of an RF generator voltage $V_g$.

6. An ignition voltage selection method that causes a plasma load to generate a plasma discharge at a load end that is an input end of the plasma load, the ignition voltage selection method performed when an RF generator unit supplies an RF AC to the plasma load via a power supply unit, the ignition voltage selection method comprising the steps of:
converting, by said RF generator unit, a DC of a DC power supply to an RF AC through a switching operation to make an internal impedance of said RF generator unit lower than a characteristic impedance of said power supply unit;
when said plasma load is in a non-discharge state, setting an electrical length $L_E$ of said power supply unit when the load end of the plasma load is in an open state to $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to a fundamental wavelength $\lambda$ of the RF AC; and
selecting a voltage of the load end of said plasma load, determined by the electrical length $L_E$, as an ignition voltage.

7. The ignition voltage selection method according to claim 6 wherein,
said power supply unit is a feed cable that electrically connects between an output end of said RF generator unit and the load end of said plasma load,
the internal impedance of said RF generator unit is lower than a characteristic impedance of said feed cable,
an electrical length $L_E$ of a cable length of said feed cable when the load end of said plasma load is in an open state is a length selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to the fundamental wavelength $\lambda$ of the RF AC, and
a voltage of the load end of said plasma load, determined by the cable length, is selected as the ignition voltage.

8. The ignition voltage selection method according to claim 6 wherein,
said power supply unit is a filter circuit that electrically connects between an output end of said RF generator unit and the load end of said plasma load, the filter circuit being a circuit of a capacitor and a reactor,
the internal impedance of said RF generator unit is lower than the characteristic impedance of said filter circuit,
values of the capacitor and the reactor of said filter circuit are adjusted so that an electrical length $L_E$ when the load end of said plasma load is in an open state is selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to the fundamental wavelength $\lambda$ of the RF AC, and a voltage of the load end of said plasma load, determined by said filter circuit, is selected as the ignition voltage.

9. The ignition voltage selection method according to claim 6 wherein, said power supply unit is a series circuit that electrically connects between an output end of said RF generator unit and the load end of said plasma load, the series circuit including a filter circuit and a feed cable, the filter circuit being a circuit of a capacitor and a reactor, the internal impedance of said RF generator unit is lower than the characteristic impedance of said series circuit, in said series circuit, a length of said feed cable and values of the capacitor and the reactor of said filter circuit are adjusted so that an electrical length $L_E$ when the load end of said plasma load is in an open state is selected as $(2n-1)\cdot(\lambda/4)-k\cdot\lambda \leq L_E \leq (2n-1)\cdot(\lambda/4)+k\cdot\lambda$ (n is an integer, k is a constant in a range of 0 to $\lambda/4$) with respect to the fundamental wavelength $\lambda$ of the RF AC, and a voltage of the load end of said plasma load, determined by said series circuit, is selected as the ignition voltage.

10. The ignition voltage selection method according to claim 6 wherein, the constant k is $\{\pi-2\cdot\cos^{-1}(1/K)\}/(4\pi)$ and is a constant defining a range of an electrical length $L_E$ that makes a load-end voltage ($V_z(z=L_E)$) the K times of an RF generator voltage $V_g$.

* * * * *